United States Patent
Ahn et al.

(10) Patent No.: US 8,026,161 B2
(45) Date of Patent: Sep. 27, 2011

(54) HIGHLY RELIABLE AMORPHOUS HIGH-K GATE OXIDE ZRO2

(75) Inventors: Kie Y. Ahn, Chappaqua, NY (US); Leonard Forbes, Corvallis, OR (US)

(73) Assignee: Micron Technology, Inc., Boise, ID (US)

( * ) Notice: Subject to any disclaimer, the term of this patent is extended or adjusted under 35 U.S.C. 154(b) by 764 days.

(21) Appl. No.: 09/945,535

(22) Filed: Aug. 30, 2001

(65) Prior Publication Data

US 2003/0045078 A1    Mar. 6, 2003

(51) Int. Cl.
*H01L 21/3205* (2006.01)
(52) U.S. Cl. ........ 438/585; 438/591; 438/785; 257/410; 257/E21.274; 257/E21.29
(58) Field of Classification Search .................. 438/585, 438/785, 591; 257/410, E21.274, E21.29
See application file for complete search history.

(56) References Cited

U.S. PATENT DOCUMENTS

| | | | |
|---|---|---|---|
| 2,501,563 A | 3/1950 | Colbert et al. | |
| 3,381,114 A | 4/1968 | Nakanuma | 219/385 |
| 4,058,430 A | 11/1977 | Suntola et al. | 427/255.13 |
| 4,215,156 A | 7/1980 | Dalal et al. | 427/84 |
| 4,333,808 A * | 6/1982 | Bhattacharyya et al. | 204/192 D |
| 4,394,673 A | 7/1983 | Thompson et al. | 357/15 |
| 4,399,424 A | 8/1983 | Rigby | 338/34 |
| 4,413,022 A | 11/1983 | Suntola et al. | 427/255.2 |
| 4,590,042 A | 5/1986 | Drage | 422/186.06 |
| 4,647,947 A * | 3/1987 | Takeoka et al. | 346/135.1 |
| 4,725,887 A * | 2/1988 | Field | 348/578 |
| 4,767,641 A | 8/1988 | Kieser et al. | 427/38 |
| 4,920,071 A * | 4/1990 | Thomas | 438/585 |
| 4,993,358 A | 2/1991 | Mahawili | 118/715 |
| 5,006,192 A | 4/1991 | Deguchi | 156/345 |
| 5,049,516 A | 9/1991 | Arima | |
| 5,055,319 A | 10/1991 | Bunshah et al. | 427/38 |
| 5,080,928 A | 1/1992 | Klinedinst et al. | 427/70 |
| 5,198,029 A | 3/1993 | Dutta et al. | 118/303 |

(Continued)

FOREIGN PATENT DOCUMENTS

EP    0540993 A1    5/1993

(Continued)

OTHER PUBLICATIONS

Milton Ohring The Materials Science of Thin Films Academic Press, Inc 1992 pp. vi, 118, 121, 125.*

(Continued)

*Primary Examiner* — Matthew Landau
*Assistant Examiner* — Colleen E Snow
(74) *Attorney, Agent, or Firm* — Schwegman, Lundberg & Woessner, P.A.

(57) ABSTRACT

A gate oxide and method of fabricating a gate oxide that produces a more reliable and thinner equivalent oxide thickness than conventional $SiO_2$ gate oxides are provided. Also shown is a gate oxide with a conduction band offset in a range of approximately 5.16 eV to 7.8 eV. Gate oxides formed from elements such as zirconium are thermodynamically stable such that the gate oxides formed will have minimal reactions with a silicon substrate or other structures during any later high temperature processing stages. The process shown is performed at lower temperatures than the prior art, which further inhibits reactions with the silicon substrate or other structures. Using a thermal evaporation technique to deposit the layer to be oxidized, the underlying substrate surface smoothness is preserved, thus providing improved and more consistent electrical properties in the resulting gate oxide.

6 Claims, 6 Drawing Sheets

U.S. PATENT DOCUMENTS

| | | | |
|---|---|---|---|
| 5,302,461 A | 4/1994 | Anthony | 428/472 |
| 5,304,622 A | 4/1994 | Ikai et al. | |
| 5,426,603 A | 6/1995 | Nakamura et al. | |
| 5,478,653 A | 12/1995 | Guenzer | |
| 5,562,952 A | 10/1996 | Nakahigashi et al. | |
| 5,587,609 A | 12/1996 | Murakami et al. | |
| 5,595,606 A | 1/1997 | Fujikawa et al. | 118/725 |
| 5,621,681 A | 4/1997 | Moon | 365/145 |
| 5,625,233 A | 4/1997 | Cabral, Jr. et al. | 257/771 |
| 5,646,583 A | 7/1997 | Seabury et al. | |
| 5,674,563 A | 10/1997 | Tarui et al. | |
| 5,698,022 A | 12/1997 | Glassman et al. | |
| 5,735,960 A | 4/1998 | Sandhu et al. | 118/723 IR |
| 5,744,374 A | 4/1998 | Moon | 437/60 |
| 5,745,334 A | 4/1998 | Hoffarth et al. | |
| 5,751,021 A | 5/1998 | Teraguchi | |
| 5,765,214 A | 6/1998 | Sywyk | |
| 5,777,923 A | 7/1998 | Lee et al. | |
| 5,789,030 A | 8/1998 | Rolfson | 429/309 |
| 5,795,808 A * | 8/1998 | Park | 438/301 |
| 5,801,105 A * | 9/1998 | Yano et al. | 438/785 |
| 5,810,923 A * | 9/1998 | Yano et al. | 117/84 |
| 5,814,584 A | 9/1998 | Tauber et al. | |
| 5,822,256 A | 10/1998 | Bauer et al. | 365/200 |
| 5,827,571 A | 10/1998 | Lee et al. | |
| 5,828,080 A | 10/1998 | Yano et al. | 257/43 |
| 5,840,897 A | 11/1998 | Kirlin et al. | 546/2 |
| 5,912,797 A | 6/1999 | Schneemeyer et al. | |
| 5,916,365 A | 6/1999 | Sherman | 117/92 |
| 5,923,056 A | 7/1999 | Lee et al. | |
| 5,950,925 A | 9/1999 | Fukunaga et al. | 239/132.3 |
| 5,972,847 A | 10/1999 | Feenstra et al. | 505/473 |
| 5,981,350 A | 11/1999 | Geusic et al. | |
| 5,999,454 A | 12/1999 | Smith | |
| 6,010,969 A | 1/2000 | Vaartstra | 438/758 |
| 6,013,553 A | 1/2000 | Wallace et al. | 438/287 |
| 6,020,024 A * | 2/2000 | Maiti et al. | 427/248.1 |
| 6,020,243 A | 2/2000 | Wallace et al. | |
| 6,025,225 A | 2/2000 | Forbes et al. | |
| 6,025,627 A | 2/2000 | Forbes et al. | 257/321 |
| 6,027,961 A * | 2/2000 | Maiti et al. | 438/119 |
| 6,034,015 A | 3/2000 | Lin et al. | |
| 6,040,243 A | 3/2000 | Li et al. | 438/687 |
| 6,057,271 A | 5/2000 | Kenjiro et al. | 505/475 |
| 6,059,885 A | 5/2000 | Ohashi et al. | 118/730 |
| 6,060,755 A | 5/2000 | Ma et al. | |
| 6,075,691 A | 6/2000 | Duenas et al. | |
| 6,090,636 A | 7/2000 | Geusic et al. | |
| 6,093,944 A | 7/2000 | VanDover | 257/310 |
| 6,110,529 A | 8/2000 | Gardiner et al. | 427/250 |
| 6,120,531 A | 9/2000 | Zhou et al. | 607/111 |
| 6,134,175 A | 10/2000 | Forbes et al. | |
| 6,146,976 A | 11/2000 | Stecher et al. | |
| 6,150,188 A | 11/2000 | Geusic et al. | |
| 6,154,280 A | 11/2000 | Borden | |
| 6,161,500 A | 12/2000 | Kopacz et al. | 118/723 E |
| 6,171,900 B1 | 1/2001 | Sun | 438/240 |
| 6,173,379 B1 | 1/2001 | Poplingher et al. | |
| 6,174,809 B1 | 1/2001 | Kang et al. | |
| 6,187,484 B1 | 2/2001 | Glass et al. | 430/5 |
| 6,191,448 B1 | 2/2001 | Forbes et al. | |
| 6,198,168 B1 | 3/2001 | Geusic et al. | |
| 6,203,613 B1 | 3/2001 | Gates et al. | 117/104 |
| 6,203,726 B1 | 3/2001 | Danielson et al. | 252/301 |
| 6,206,972 B1 | 3/2001 | Dunham | 118/715 |
| 6,207,589 B1 * | 3/2001 | Ma et al. | 438/785 |
| 6,211,035 B1 * | 4/2001 | Moise et al. | 438/396 |
| 6,217,645 B1 | 4/2001 | Vaartstra | 106/287.18 |
| 6,225,168 B1 | 5/2001 | Gardner et al. | 438/287 |
| 6,225,237 B1 | 5/2001 | Vaartstra | 438/778 |
| 6,232,847 B1 | 5/2001 | Marcy, 5th et al. | 331/167 |
| 6,258,637 B1 | 7/2001 | Wilk et al. | |
| 6,270,835 B1 | 8/2001 | Hunt et al. | |
| 6,273,951 B1 | 8/2001 | Vaartstra | 117/104 |
| 6,281,144 B1 | 8/2001 | Cleary et al. | 438/780 |
| 6,291,866 B1 | 9/2001 | Wallace et al. | 257/410 |
| 6,294,813 B1 | 9/2001 | Forbes et al. | 257/321 |
| 6,297,516 B1 | 10/2001 | Forrest et al. | 257/40 |
| 6,297,539 B1 | 10/2001 | Ma et al. | 257/410 |
| 6,300,203 B1 | 10/2001 | Buynoski et al. | 438/287 |
| 6,302,964 B1 | 10/2001 | Umotoy et al. | 118/715 |
| 6,303,481 B2 | 10/2001 | Park | 438/591 |
| 6,313,035 B1 | 11/2001 | Sandhu et al. | |
| 6,317,357 B1 | 11/2001 | Forbes | |
| 6,331,465 B1 | 12/2001 | Forbes et al. | 438/260 |
| 6,348,386 B1 | 2/2002 | Gilmer | 438/288 |
| 6,365,470 B1 | 4/2002 | Maeda | |
| 6,368,398 B2 | 4/2002 | Vaartstra | |
| 6,368,518 B1 | 4/2002 | Vaartstra | 216/67 |
| 6,368,941 B1 | 4/2002 | Chen et al. | 438/424 |
| 6,380,579 B1 | 4/2002 | Nam et al. | 257/306 |
| 6,381,168 B2 | 4/2002 | Forbes | |
| 6,383,861 B1 | 5/2002 | Gonzalez et al. | |
| 6,387,712 B1 * | 5/2002 | Yano et al. | 438/3 |
| 6,391,769 B1 | 5/2002 | Lee et al. | 438/643 |
| 6,392,257 B1 | 5/2002 | Ramdani et al. | |
| 6,395,650 B1 | 5/2002 | Callegari et al. | |
| 6,399,979 B1 | 6/2002 | Noble et al. | |
| 6,404,027 B1 | 6/2002 | Hong et al. | |
| 6,407,427 B1 | 6/2002 | Oh | |
| 6,418,050 B2 | 7/2002 | Forbes | |
| 6,420,279 B1 | 7/2002 | Ono et al. | 438/785 |
| 6,429,065 B2 | 8/2002 | Forbes | |
| 6,432,779 B1 | 8/2002 | Hobbs et al. | 438/287 |
| 6,433,993 B1 | 8/2002 | Hunt et al. | |
| 6,434,041 B2 | 8/2002 | Forbes et al. | |
| 6,441,417 B1 | 8/2002 | Zhang et al. | |
| 6,444,039 B1 | 9/2002 | Nguyen | 118/715 |
| 6,444,592 B1 | 9/2002 | Ballantine et al. | |
| 6,444,895 B1 | 9/2002 | Nikawa | 136/212 |
| 6,445,023 B1 | 9/2002 | Vaartstra et al. | 257/295 |
| 6,448,192 B1 | 9/2002 | Kaushik | 438/785 |
| 6,451,641 B1 | 9/2002 | Halliyal et al. | 438/200 |
| 6,451,662 B1 | 9/2002 | Chudzik et al. | 438/386 |
| 6,451,695 B2 | 9/2002 | Sneh | 438/685 |
| 6,454,912 B1 | 9/2002 | Ahn et al. | |
| 6,455,717 B1 | 9/2002 | Vaartstra | 556/1 |
| 6,458,701 B1 | 10/2002 | Chae et al. | 438/680 |
| 6,461,914 B1 | 10/2002 | Roberts et al. | 438/253 |
| 6,465,298 B2 | 10/2002 | Forbes et al. | |
| 6,465,334 B1 | 10/2002 | Buynoski et al. | 438/591 |
| 6,465,853 B1 | 10/2002 | Hobbs et al. | |
| 6,476,434 B1 | 11/2002 | Noble et al. | |
| 6,482,740 B2 | 11/2002 | Soininen et al. | 438/686 |
| 6,486,027 B1 | 11/2002 | Noble et al. | |
| 6,486,703 B2 | 11/2002 | Noble et al. | |
| 6,492,233 B2 | 12/2002 | Forbes et al. | |
| 6,495,436 B2 | 12/2002 | Ahn et al. | 438/591 |
| 6,498,063 B1 | 12/2002 | Ping | 438/253 |
| 6,498,065 B1 | 12/2002 | Forbes et al. | |
| 6,509,280 B2 | 1/2003 | Choi | |
| 6,514,828 B2 | 2/2003 | Ahn et al. | 438/297 |
| 6,515,510 B2 | 2/2003 | Noble et al. | |
| 6,518,610 B2 | 2/2003 | Yang et al. | 257/295 |
| 6,518,615 B1 | 2/2003 | Geusic et al. | |
| 6,518,634 B1 | 2/2003 | Kaushik et al. | |
| 6,521,911 B2 | 2/2003 | Parsons et al. | 257/52 |
| 6,524,867 B2 | 2/2003 | Yang et al. | 438/3 |
| 6,524,901 B1 | 2/2003 | Trivedi | 438/183 |
| 6,526,191 B1 | 2/2003 | Geusic et al. | |
| 6,527,866 B1 | 3/2003 | Matijasevic et al. | 118/719 |
| 6,531,354 B2 | 3/2003 | Maria et al. | 438/216 |
| 6,534,420 B2 | 3/2003 | Ahn et al. | 438/768 |
| 6,537,613 B1 | 3/2003 | Senzaki et al. | 427/250 |
| 6,538,330 B1 | 3/2003 | Forbes | |
| 6,541,280 B2 | 4/2003 | Kaushik et al. | |
| 6,544,875 B1 | 4/2003 | Wilk | 438/591 |
| 6,573,199 B2 | 6/2003 | Sandhu et al. | 438/798 |
| 6,586,349 B1 | 7/2003 | Jeon et al. | |
| 6,586,792 B2 | 7/2003 | Ahn et al. | 257/295 |
| 6,590,252 B2 | 7/2003 | Kutsunai et al. | |
| 6,593,610 B2 | 7/2003 | Gonzalez | 257/296 |
| 6,597,037 B1 | 7/2003 | Forbes et al. | |
| 6,602,338 B2 | 8/2003 | Chen et al. | 106/287.19 |
| 6,608,378 B2 | 8/2003 | Ahn et al. | 257/701 |
| 6,613,702 B2 | 9/2003 | Sandhu et al. | 438/798 |
| 6,617,639 B1 | 9/2003 | Wang et al. | |

| Patent No. | Date | Inventor | Class |
|---|---|---|---|
| 6,620,670 B2 | 9/2003 | Song et al. | 438/216 |
| 6,620,752 B2 | 9/2003 | Messing et al. | |
| 6,627,503 B2 | 9/2003 | Ma et al. | 438/287 |
| 6,632,279 B1 | 10/2003 | Ritala et al. | |
| 6,639,267 B2 | 10/2003 | Eldridge | 257/310 |
| 6,642,573 B1 | 11/2003 | Halliyal et al. | |
| 6,645,882 B1 | 11/2003 | Halliyal et al. | 438/785 |
| 6,660,660 B2 | 12/2003 | Haukka et al. | 438/778 |
| 6,661,058 B2 | 12/2003 | Ahn et al. | 257/344 |
| 6,674,138 B1 | 1/2004 | Halliyal et al. | |
| 6,682,602 B2 | 1/2004 | Vaartstra | 118/715 |
| 6,683,005 B2 | 1/2004 | Sandhu et al. | 438/715 |
| 6,683,011 B2 | 1/2004 | Smith et al. | 438/785 |
| 6,686,212 B1 | 2/2004 | Conley, Jr. et al. | |
| 6,689,660 B1 | 2/2004 | Noble et al. | |
| 6,696,332 B2 | 2/2004 | Visokay et al. | 438/216 |
| 6,699,745 B1 | 3/2004 | Banerjee et al. | 438/238 |
| 6,699,747 B2 | 3/2004 | Ruff et al. | |
| 6,709,978 B2 | 3/2004 | Geusic et al. | |
| 6,709,989 B2 | 3/2004 | Ramdani et al. | |
| 6,713,846 B1 | 3/2004 | Senzaki | 257/635 |
| 6,723,577 B1 | 4/2004 | Geusic et al. | |
| 6,728,092 B2 | 4/2004 | Hunt et al. | |
| 6,730,575 B2 | 5/2004 | Eldridge | 257/310 |
| 6,740,605 B1 | 5/2004 | Shiraiwa et al. | |
| 6,750,066 B1 | 6/2004 | Cheung et al. | 438/3 |
| 6,753,567 B2 | 6/2004 | Maria et al. | |
| 6,754,108 B2 | 6/2004 | Forbes | |
| 6,756,298 B2 | 6/2004 | Ahn et al. | |
| 6,759,081 B2 | 7/2004 | Huganen et al. | |
| 6,762,114 B1 | 7/2004 | Chambers | 438/591 |
| 6,764,901 B2 | 7/2004 | Noble | |
| 6,767,795 B2 | 7/2004 | Ahn | |
| 6,777,353 B2 | 8/2004 | Putkonen | |
| 6,777,715 B1 | 8/2004 | Geusic et al. | |
| 6,778,441 B2 | 8/2004 | Forbes et al. | |
| 6,787,370 B2 | 9/2004 | Forbes | |
| 6,787,413 B2 | 9/2004 | Ahn | |
| 6,790,791 B2 | 9/2004 | Ahn et al. | |
| 6,804,136 B2 | 10/2004 | Forbes | |
| 6,812,100 B2 | 11/2004 | Ahn et al. | |
| 6,812,513 B2 | 11/2004 | Geusic et al. | |
| 6,812,516 B2 | 11/2004 | Noble, Jr. et al. | |
| 6,818,937 B2 | 11/2004 | Noble et al. | |
| 6,821,862 B2 | 11/2004 | Cho | |
| 6,821,873 B2 | 11/2004 | Visokay et al. | |
| 6,828,632 B2 | 12/2004 | Bhattacharyya | |
| 6,844,203 B2 | 1/2005 | Ahn et al. | |
| 6,858,120 B2 | 2/2005 | Ahn et al. | |
| 6,858,444 B2 | 2/2005 | Ahn et al. | |
| 6,884,739 B2 | 4/2005 | Ahn et al. | |
| 6,888,739 B2 | 5/2005 | Forbes | |
| 6,893,984 B2 | 5/2005 | Ahn et al. | |
| 6,900,122 B2 | 5/2005 | Ahn et al. | |
| 6,914,800 B2 | 7/2005 | Ahn et al. | |
| 6,919,266 B2 | 7/2005 | Ahn et al. | |
| 6,921,702 B2 | 7/2005 | Ahn et al. | |
| 6,930,059 B2 | 8/2005 | Conley, Jr. et al. | |
| 6,930,346 B2 | 8/2005 | Ahn et al. | |
| 6,953,730 B2 | 10/2005 | Ahn et al. | |
| 6,958,302 B2 | 10/2005 | Ahn et al. | |
| 6,979,855 B2 | 12/2005 | Ahn et al. | |
| 6,989,565 B1 | 1/2006 | Aronowitz et al. | |
| 7,012,311 B2 | 3/2006 | Ohmi et al. | |
| 7,026,694 B2 | 4/2006 | Ahn et al. | |
| 7,045,430 B2 | 5/2006 | Ahn et al. | |
| 7,049,192 B2 | 5/2006 | Ahn et al. | |
| 7,064,058 B2 | 6/2006 | Ahn et al. | |
| 7,081,421 B2 | 7/2006 | Ahn et al. | |
| 7,084,078 B2 | 8/2006 | Ahn et al. | |
| 7,101,813 B2 | 9/2006 | Ahn et al. | |
| 7,129,553 B2 | 10/2006 | Ahn et al. | |
| 7,135,369 B2 | 11/2006 | Ahn et al. | |
| 7,135,421 B2 | 11/2006 | Ahn et al. | |
| 7,169,673 B2 | 1/2007 | Ahn et al. | |
| 7,309,664 B1 | 12/2007 | Marzolin et al. | |
| 2001/0002280 A1 | 5/2001 | Sneh | 427/255.28 |
| 2001/0009695 A1 | 7/2001 | Saanila et al. | 427/255.39 |
| 2001/0030352 A1 | 10/2001 | Ruff et al. | |
| 2001/0042505 A1 | 11/2001 | Vaartstra | 117/104 |
| 2001/0051442 A1 | 12/2001 | Katsir et al. | 438/758 |
| 2001/0053082 A1 | 12/2001 | Chipalkatti et al. | 362/496 |
| 2002/0001971 A1 | 1/2002 | Cho | 438/765 |
| 2002/0019116 A1 | 2/2002 | Sandhu et al. | |
| 2002/0022156 A1 | 2/2002 | Bright | 428/698 |
| 2002/0086507 A1 | 7/2002 | Park et al. | 438/585 |
| 2002/0089023 A1 | 7/2002 | Yu et al. | 257/411 |
| 2002/0094632 A1 | 7/2002 | Agarwal et al. | |
| 2002/0111001 A1 | 8/2002 | Ahn et al. | 438/592 |
| 2002/0119297 A1 | 8/2002 | Forrest et al. | 428/199 |
| 2002/0142536 A1 | 10/2002 | Zhang et al. | |
| 2002/0145845 A1 | 10/2002 | Hunt et al. | |
| 2002/0146916 A1 | 10/2002 | Irino et al. | 438/785 |
| 2002/0155688 A1 | 10/2002 | Ahn | |
| 2002/0155689 A1 | 10/2002 | Ahn | |
| 2002/0176989 A1 | 11/2002 | Knudsen et al. | |
| 2002/0192974 A1 | 12/2002 | Ahn et al. | 438/722 |
| 2002/0192975 A1 | 12/2002 | Ahn | |
| 2002/0192979 A1 | 12/2002 | Ahn | |
| 2003/0001212 A1 | 1/2003 | Hu et al. | 257/388 |
| 2003/0001241 A1 | 1/2003 | Chakrabarti et al. | 257/643 |
| 2003/0003635 A1 | 1/2003 | Paranjpe et al. | |
| 2003/0003702 A1 | 1/2003 | Ahn et al. | 438/591 |
| 2003/0003722 A1 | 1/2003 | Vaartstra | 438/656 |
| 2003/0017717 A1 | 1/2003 | Ahn | |
| 2003/0032270 A1 | 2/2003 | Snyder et al. | |
| 2003/0042526 A1 | 3/2003 | Weimer | 257/309 |
| 2003/0043637 A1 | 3/2003 | Forbes et al. | |
| 2003/0045060 A1 | 3/2003 | Ahn | |
| 2003/0049942 A1 | 3/2003 | Haukka et al. | |
| 2003/0052356 A1 | 3/2003 | Yang et al. | 257/309 |
| 2003/0052358 A1 | 3/2003 | Weimer | 257/310 |
| 2003/0059535 A1 | 3/2003 | Luo et al. | |
| 2003/0062261 A1 | 4/2003 | Shindo | |
| 2003/0102501 A1 | 6/2003 | Yang et al. | 257/295 |
| 2003/0119246 A1 | 6/2003 | Ahn | |
| 2003/0119291 A1 | 6/2003 | Ahn et al. | |
| 2003/0119313 A1 | 6/2003 | Yang et al. | 438/681 |
| 2003/0124794 A1 | 7/2003 | Girardie | |
| 2003/0132491 A1 | 7/2003 | Ahn | |
| 2003/0157764 A1 | 8/2003 | Ahn et al. | 438/212 |
| 2003/0175411 A1 | 9/2003 | Kodas et al. | 427/58 |
| 2003/0181060 A1 | 9/2003 | Asai et al. | |
| 2003/0185980 A1 | 10/2003 | Endo | |
| 2003/0193061 A1 | 10/2003 | Osten | |
| 2003/0207032 A1 | 11/2003 | Ahn et al. | |
| 2003/0207540 A1 | 11/2003 | Ahn et al. | |
| 2003/0207593 A1 | 11/2003 | Derderian et al. | 438/778 |
| 2003/0222300 A1 | 12/2003 | Basceri et al. | 257/309 |
| 2003/0224600 A1 | 12/2003 | Cao et al. | 438/684 |
| 2003/0227033 A1 | 12/2003 | Ahn et al. | |
| 2003/0228747 A1 | 12/2003 | Ahn et al. | 438/591 |
| 2003/0232511 A1 | 12/2003 | Metzner et al. | 438/785 |
| 2003/0235961 A1 | 12/2003 | Metzner et al. | |
| 2004/0007171 A1 | 1/2004 | Ritala et al. | |
| 2004/0009679 A1 | 1/2004 | Yeo et al. | |
| 2004/0023461 A1 | 2/2004 | Ahn et al. | |
| 2004/0033661 A1 | 2/2004 | Yeo et al. | |
| 2004/0033681 A1 | 2/2004 | Ahn et al. | 438/591 |
| 2004/0033701 A1 | 2/2004 | Ahn et al. | 438/785 |
| 2004/0038525 A1 | 2/2004 | Meng et al. | 438/656 |
| 2004/0038554 A1 | 2/2004 | Ahn | |
| 2004/0043541 A1 | 3/2004 | Ahn | |
| 2004/0043557 A1 | 3/2004 | Haukka et al. | 438/240 |
| 2004/0043569 A1 | 3/2004 | Ahn | |
| 2004/0065255 A1 | 4/2004 | Yang et al. | 118/715 |
| 2004/0075111 A1 | 4/2004 | Chidambarrao et al. | |
| 2004/0087124 A1 | 5/2004 | Kubota et al. | 438/591 |
| 2004/0099889 A1 | 5/2004 | Frank et al. | 257/288 |
| 2004/0110348 A1 | 6/2004 | Ahn et al. | |
| 2004/0110391 A1 | 6/2004 | Ahn et al. | |
| 2004/0135186 A1 | 7/2004 | Yamamoto | |
| 2004/0144980 A1 | 7/2004 | Ahn et al. | |
| 2004/0156578 A1 | 8/2004 | Geusic et al. | |
| 2004/0159863 A1 | 8/2004 | Eldridge et al. | |
| 2004/0161899 A1 | 8/2004 | Luo et al. | |
| 2004/0164357 A1 | 8/2004 | Ahn et al. | |
| 2004/0164365 A1 | 8/2004 | Ahn et al. | |

| | | |
|---|---|---|
| 2004/0168627 A1 | 9/2004 | Conley, Jr. et al. |
| 2004/0171280 A1 | 9/2004 | Conley, Jr. et al. |
| 2004/0175882 A1 | 9/2004 | Ahn et al. |
| 2004/0183108 A1 | 9/2004 | Ahn |
| 2004/0185654 A1 | 9/2004 | Ahn |
| 2004/0196620 A1 | 10/2004 | Knudsen et al. |
| 2004/0198069 A1 | 10/2004 | Metzner et al. |
| 2004/0203254 A1 | 10/2004 | Conley, Jr. et al. |
| 2004/0214399 A1 | 10/2004 | Ahn et al. |
| 2004/0219783 A1 | 11/2004 | Ahn et al. |
| 2004/0222476 A1 | 11/2004 | Ahn et al. |
| 2004/0233010 A1 | 11/2004 | Akram et al. |
| 2004/0235313 A1 | 11/2004 | Frank et al. |
| 2004/0262700 A1 | 12/2004 | Ahn et al. |
| 2004/0264236 A1 | 12/2004 | Chae et al. |
| 2004/0266217 A1 | 12/2004 | Kim et al. |
| 2005/0009370 A1 | 1/2005 | Ahn et al. |
| 2005/0020017 A1 | 1/2005 | Ahn et al. |
| 2005/0023574 A1 | 2/2005 | Forbes et al. |
| 2005/0023578 A1 | 2/2005 | Bhattacharyya |
| 2005/0023594 A1 | 2/2005 | Ahn et al. |
| 2005/0023595 A1 | 2/2005 | Forbes et al. |
| 2005/0023602 A1 | 2/2005 | Forbes et al. |
| 2005/0023603 A1 | 2/2005 | Eldridge et al. |
| 2005/0023613 A1 | 2/2005 | Bhattacharyya |
| 2005/0023624 A1 | 2/2005 | Ahn et al. |
| 2005/0023625 A1 | 2/2005 | Ahn et al. |
| 2005/0023626 A1 | 2/2005 | Ahn et al. |
| 2005/0023627 A1 | 2/2005 | Ahn et al. |
| 2005/0024092 A1 | 2/2005 | Forbes |
| 2005/0026349 A1 | 2/2005 | Forbes et al. |
| 2005/0026360 A1 | 2/2005 | Geusic et al. |
| 2005/0026374 A1 | 2/2005 | Ahn et al. |
| 2005/0029547 A1 | 2/2005 | Ahn et al. |
| 2005/0029604 A1 | 2/2005 | Ahn et al. |
| 2005/0029605 A1 | 2/2005 | Ahn et al. |
| 2005/0030825 A1 | 2/2005 | Ahn |
| 2005/0032292 A1 | 2/2005 | Ahn et al. |
| 2005/0032342 A1 | 2/2005 | Forbes et al. |
| 2005/0037563 A1 | 2/2005 | Ahn et al. |
| 2005/0051828 A1 | 3/2005 | Park et al. |
| 2005/0054165 A1 | 3/2005 | Ahn et al. |
| 2005/0077519 A1 | 4/2005 | Ahn et al. |
| 2005/0124174 A1 | 6/2005 | Ahn et al. |
| 2005/0138262 A1 | 6/2005 | Forbes |
| 2005/0140462 A1 | 6/2005 | Akram et al. |
| 2005/0145957 A1 | 7/2005 | Ahn et al. |
| 2005/0145959 A1 | 7/2005 | Forbes et al. |
| 2005/0158973 A1 | 7/2005 | Ahn et al. |
| 2005/0164521 A1 | 7/2005 | Ahn et al. |
| 2005/0227442 A1 | 10/2005 | Ahn et al. |
| 2005/0260357 A1 | 11/2005 | Olsen et al. |
| 2005/0277256 A1 | 12/2005 | Ahn et al. |
| 2005/0280067 A1 | 12/2005 | Ahn et al. |
| 2006/0001151 A1 | 1/2006 | Ahn et al. |
| 2006/0003517 A1 | 1/2006 | Ahn et al. |
| 2006/0023513 A1 | 2/2006 | Forbes et al. |
| 2006/0024975 A1 | 2/2006 | Ahn et al. |
| 2006/0028867 A1 | 2/2006 | Forbes et al. |
| 2006/0028869 A1 | 2/2006 | Forbes et al. |
| 2006/0043492 A1 | 3/2006 | Ahn et al. |
| 2006/0043504 A1 | 3/2006 | Ahn et al. |
| 2006/0046505 A1 | 3/2006 | Ahn et al. |
| 2006/0046522 A1 | 3/2006 | Ahn et al. |
| 2006/0054943 A1 | 3/2006 | Li et al. |
| 2006/0125030 A1 | 6/2006 | Ahn et al. |
| 2006/0128168 A1 | 6/2006 | Ahn et al. |
| 2006/0148180 A1 | 7/2006 | Ahn et al. |
| 2006/0176645 A1 | 8/2006 | Ahn et al. |
| 2006/0183272 A1 | 8/2006 | Ahn et al. |
| 2006/0189154 A1 | 8/2006 | Ahn et al. |
| 2006/0223337 A1 | 10/2006 | Ahn et al. |
| 2006/0228868 A1 | 10/2006 | Ahn et al. |
| 2006/0237764 A1 | 10/2006 | Ahn et al. |
| 2006/0244082 A1 | 11/2006 | Ahn et al. |
| 2006/0244100 A1 | 11/2006 | Ahn et al. |
| 2006/0246741 A1 | 11/2006 | Ahn et al. |
| 2006/0252211 A1 | 11/2006 | Ahn et al. |

FOREIGN PATENT DOCUMENTS

| | | |
|---|---|---|
| EP | 1122795 A2 | 8/2001 |
| EP | 1324376 | 7/2003 |
| EP | 1324376 A1 | 7/2003 |
| JP | 62-199019 | 9/1987 |
| JP | 5090169 | 4/1993 |
| JP | 2001-332546 | 11/2001 |
| WO | WO-2004079796 A3 | 9/2004 |
| WO | WO-2006026716 | 3/2006 |
| WO | WO-2006026716 A1 | 3/2006 |

OTHER PUBLICATIONS

Chambers, J J., et al., "Physical and electrical characterization of ultrathin yttrium silicate insulators on silicon", *Journal of Applied Physics*, 90(2), (Jul. 15, 2001), 918-33.

Kukli, Kaupo, et al., "Low-Temperature Deposition of Zirconium Oxide-Based Nanocrystalline Films by Alternate Supply of Zr[OC(CH3)3]4 and H2O", *Chemical Vapor Deposition*, 6(6), (2000), 297-302.

Nakajima, Anri, "Soft breakdown free atomic-layer-deposited silicon-nitride/SiO/sub 2/ stack gate dielectrics", *International Electron Devices Meeting. Technical Digest*, (2001), 6.5.1-4.

Rahtu, Antti , et al., "Atomic Layer Deposition of Zirconium Titanium Oxide from Titanium Isopropoxide and Zirconium Chloride", *Chemistry of Materials*, 13(5), (May 2001), 1528-1532.

Wolf, S., et al., *In: Silicon Processing of the VLSI Era*, vol. 1, Lattice Press, 374-380.

Hoshino, Y. , et al., "Characterization and Control of the HfO2/Si(001) Interfaces", *Applied Physics Letters*, 81, (Sep. 30, 2002), 2650-2652.

Wolf, S. , et al., *Silicon Processing for the VLSI Era—vol. 4: Deep-Submicron Process Technology*, Lattice Press, Sunset Beach, CA, (2002), p. 98, 146, 173-174.

*PCT Search Report* dated Oct. 15, 2003 for application PCT/US03/17730 completed by S. Nesso.

"Improved Metallurgy for Wiring Very Large Scale Integrated Circuits", *International Technology Disclosures*, 4, Abstract,(1986),1 page.

Braud, F. , "Ultra Thin Diffusion Barriers for Cu Interconnections at the Gigabit Generation and Beyond", *VMIC Conference Proceedings*, (1996),174-179.

Callegari, A. , et al., "Physical and electrical characterization of Hafnium oxide and Hafnium silicate sputtered films", *Journal of Applied Physics*, 90(12), (Dec. 15, 2001),6466-75.

Chang, Hyo S., et al., "Excellent thermal stability of Al2O3/ZrO2/Al2O3 stack structure of metal-oxide-semiconductor gate dielectrics application", *Applied Physics Letters*, 80(18), (May 6, 2002),3385-7.

Chen, P. J., et al., "Thermal stability ans scalability of Zr-aluminate-based high-k gate stacks", *Symposium on VLSI Technology Digest*, (2002),192-3.

Clark, P , "IMEC Highlights Hafnium, Metal Gates for High-k Integration", *Semiconductor Business News*, at Silicon Strategies.com,(Oct. 11, 2002),2 pages.

Colombo, D. , et al., "Anhydrous Metal Nitrates as Volatile Single Source Precursors for the CVD of Metal Oxide Films", *Communications, Department of EE, U of M, Mpls*, MN, (Jul. 7, 1998),3 pages.

Conley Jr., J F., et al., "Atomic Layer Depostion of Hafnium Oxide Using Anhydrous Hafnium Nitrate", *Electrochemical and Solid State Letters*, 5(5), (2002),C57-C59.

Da Rosa, E B., et al., "Annealing of ZrAl/sub x/O/sub y/ ultrathin films on Si in a vacuum or in O/sub 2/", *Journal of the Electrochemical Society*, 148 (12), (Dec. 2001),G695-G703.

Ding, "Copper Barrier, Seed Layer and Planerization Technologies", *VMIC Conference Proceedings*, (1997),87-92.

Fukumoto, Hirofumi , et al., "Heteroepitaxial growth of Y2O3 films on silicon", *Applied Physics Letters*, 55(4), (Jul. 24, 1989),360-361.

Fuyuki, Takashi , et al., "Electronic Properties of the Interface between Si and TiO2 Deposited at Very Low Temperatures", *Japanese Journal of Applied Physics*, 25(9), (Sep. 1986),1288-1291.

Guo, Xin , et al., "High quality ultra-thin (1.5 nm) TiO2-Si3N 4 gate dielectric for deep sub-micron CMOS technology", *IEDM Technical*

Digest. International Electron Devices Meeting, Ctied in related application,(Dec. 5-8, 1999),137-140.

Iijima, T. , "Microstructure and Electrical Properties of Amorphous W-Si-N Barrier Layer for Cu Interconnections", *1996 VMIC Conference*, (1996),168-173.

Jeon, Sanghun , et al., "Ultrathin nitrided-nanolaminate (Al2O3/ZrO2/Al2O3) for metal?oxide?semiconductor gate dielectric applications", *Journal of Vacuum Science & Technology B: Microelectronics and Nanometer Structures*, 20(3), (May 2002),1143-5.

Kwo, J. , et al., "High gate dielectrics Gd2O3 and Y2O3 for silicon", *Applied Physics Letters*, 77(1), (Jul. 3, 2000),130-132.

Kwo, J. , "Properties of high k gate dielectrics Gd2O3 and Y2O3 for Si", *Journal of Applied Physics*, 89(7), (2001),3920-3927.

Laursen, T. , "Encapsulation of Copper by Nitridation of Cu-Ti Alloy/Bilayer Structures", *International Conference on Metallurgical Coatings and Thin Films*, Abstract No. H1.03, San Diego, CA,(Apr. 1997),309.

Lee, S. J., et al., "Hafnium oxide gate stack prepared by in situ rapid thermal chemical vapor deposition process for advanced gate dielectrics", *Journal of Applied Physics*, 92 (5), (Sep. 1, 2002),2807-09.

Lee, Cheng-Chung , et al., "Ion-assistend deposition of silver films", *Thin Solid Films*, vol. 359, (2000),95-97.

Lee, et al., "Ultrathin Hafnium Oxide with Low Leakage and excellent Reliability fo rAlternative Gae Dielecric Application", *IEEE Technical Digest of International Electron Devices Meeting 1999*, (1999),133-136.

Luan, et al., "High Quality Ta2O5 Gate Dielectrics and T[ . . . ]", *IEEE Technical Digest of Int. Elec. Devices Mtng 1999*, (1999),141-142.

Martin, et al., "Ion-beam-assisted deposition of thin films", *Applied Optics*, 22(1), (1983),178-184.

None Identified, "Improved Metallurgy for Wiring Very Large Scale Integrated Circuits", *International Technology Disclosures*, vol. 4, No. 9, (1986),p. 2.

Ohmi, S, et al, "Rare Earth Metal Oxides for High-K Gate Insulator", *Semiconductor Silicon 2002, vol. 1, Electrochemical Society Proceedings 2002-2*, p. 376-387.

Ryu, Changsup , "Barriers for Copper Interconnections", *Solid State Technology*, 42(4), (Apr. 1999),pp. 1-3.

Smith, Ryan C., et al., "Chemical Vapour Deposition of the Oxides of Titanium, Zirconium and Hafnium for Use as High-k Materials in Microelectronic Devices. A Carbon-free Precursor for the Synthesis of Hafnium Dioxide", *Advanced Materials for Optics and Electronics*, 10(3-5) (Jun. 29, 2000), 105-14.

Souche, D , et al., "Visible and infrared ellipsometry study of ion assisted SiO2 films", *Thin Solid Films*, 313-314, (1998),676-681.

Stathis, J. H., et al., "Reliability Projection for Ultra-Thin Oxides at Low Voltage", *Tech. Dig. International Electron Device Meeting*, (1998),167-9.

Yamamoto, K. , et al., "Effect of Hf metal predeposition on the properties of sputtered HfO2/Hf stacked gate dielectrics", *Applied Physics Letters*, 81(11), (Sep. 9, 2002),2053-5.

Aarik, J , et al., *Thin Solid Films*, 340, (1999),110-116.

Aarik, Jaan , et al., "Atomic layer growth of epitaxial TiO/sub 2/ thin films from TiCl/sub 4/ and H/sub 2/O on alpha-Al/sub 2/O/sub 3/ substrates", *Journal of Crystal Growth*, vol. 242, No. 1-2, (2002),189-198.

Aarik, Jaan , et al., "Phase transformations in hafnium dioxide thin films grown by atomic layer doposition at high temperatures", *Applied Surface Science*, 173, (2001),15-21.

Aarik, Jaan , et al., "Texture Development in nanocrystalline hafnium dioxide thin films grown by atomic layer deposition" *Journal of Crystal Growth*, 220, (2000),105-113.

Alen, Petra , et al., "Atomic Layer deposition of Ta(Al)N(C) thin films using trimethylaluminum as a reducing agent", *Journal of the Electrochemical Society*, vol. 148, No. 10, (Oct. 2001),G566-G571.

Bendoraitis, J G., et al., *Jour. Phys. Chem.*, 69(10), (1965),3666-3667.

Bunshah, Rointan F., et al., "Deposition Technologies for Films and Coatings: Developments and Applications", Noyes Publications,102-103.

Cava, R J., et al., "Improvement of the dielectric properties of Ta/sub 2/O/sub 5/ through substitution with Al/sub 2/O/sub 3/", *Applied Physics Letters*, vol. 70, No. 11, (Mar. 1997),1396-8.

Copel, M. , et al., "Structure and stability of ultrathin zirconium oxide layers on Si(001)", *Applied Physics Letters*, vol. 76, No. 4, (Jan. 2000),436-438.

De Flaviis, Franco , et al., "Planar microwave integrated phase-shifter design with high purity ferroelectric material", *IEEE Transactions on Microwave Theory & Techniques*, vol. 45, No. 6, (Jun. 1997),963-969.

Desu, S.B. , "Minimization of Fatigue in Ferroelectric Films", *Phys. Stat. Sol.* (a) 151, (1995),467-480.

Dusco, C , et al., "Deposition of tin oxide into porous silicon by atomic layer epitaxy", *J. Electrochem. Soc.*, 143, (1996),683-687.

El-Kareh, B , et al., "The evolution of DRAM cell Technology", *Solid State Technology*, (1997),89.

Engelhardt, M. , "Modern Applications of Plasma Etching and Patterning in Silicon Process Technology", *Contrib. Plasma. Phys.*, 39(5), (1999),473-478.

Forsgren, K , *Comprehensive Summaries of Uppsala Dissertation from the Faculty of Science and Technology*, 665, (2001),37.

Forsgren, Katarina , et al., "Atomic Layer Deposition of HfO2 using hafnium iodide", *Conference held in Monterey*, California, (May 2001),1 page.

Fuyuki, Takashi , et al., "Electronic Properties of the Interface between Si and TiO2 Deposited at Very Low Temperatures", *Journal of Applied Physics*, (1986),1288-1291.

Gartner, M , et al., "Spectroellipsometric characterization of lanthanide-doped TiO2 films obtained via the sol-gel technique", *Thin Solid Films*, (1993),561-565.

Geller, S. , et al., "Crystallographic Studies of Perovskite-like Compounds. II. Rare Earth Aluminates", *Acta Cryst.* vol. 9, (May 1956),1019-1025.

Giess, E. A., et al., "Lanthanide gallate perovskite-type substrates for epitaxial, high-Tc superconducting Ba2YCu3O7—films", *IBM J. Res. Develop.* vol. 34, No. 6, (Nov. 1990),916-926.

Guillamot, B , et al., *Technical Digest of International Electron Devices Meeting 2002*, (2002),355-358.

Gusev, E P., et al., "Ultrathin High-K Dielectrics Grown by Atomic Layer Deposition: A Comparative Study of ZrO2, HfO2, Y2O3 and Al2O3", *Electrochemical Society Proceedings* vol. 2001-9, (2001),189-195.

Gutowski, M J., *J. Appl. Phys.*, 80, (2002),1897-1899.

Hunt, C. E., et al., "Direct bonding of micromachined silicon wafers for laser diode heat exchanger applications", *J. Micromech. Microeng.*, 1, (1991),152-156.

Iddles, D M., et al., "Relationships between dopants, microstructure and the microwave dielectric properties of ZrO2-TiO2-SnO2 ceramics", *Journal of Materials Science*, vol. 27, (1992),6303-6310.

Jeon, Sanghun , et al., "Excellent Electrical Characteristics of Lanthanide (Pr, Nd, Sm, Gd, and Dy) Oxide and Lanthanide-doped Oxide for MOS Gate Dielectric Applications", *Technical Digest of IEDM*, (2001),471-474.

Jung, H S., et al., *Technical Digest of International Electron Devices Meeting 2002*, (2002),853-856.

Kang, L , et al., *Tech. Dig. Int. Electron Devices Meet.*, 2000, (2000),35.

Keomany, D. , et al., "Sol gel preparation of mixed cerium-titanium oxide thin films", *Sol. Energy Mater. So. Cells*, 33,(1994),pp. 429-441.

Kim, Y W., et al., *Technical Digest of International Electron Devices Meeting 2002*, (2002),69-72.

Kim, D. , et al., "Atomic Control of Substrate Termination and Heteroepitaxial Growth of SrTiO3/LaAlO3 Films", *Journal of the Korean Physical Society* vol. 36 No. 6, (Jun. 2000),444-448.

Kim, Byoung-Youp , et al., "Comparison study for TiN films deposited from different method: chemical vapor deposition and atomic layer deposition", *Mechanisms of Surface and Microstructure Evolution in Deposited Films and Film Structures Symposium (Materials Research Society Symposium Proceedings* vol. 672), (2001),7.8.1-7.8.6.

Kim, Taeseok , et al., "Correlation between strain and dielectric properties in ZrTiO/sub 4/ thin films", *Applied Physics Letters*, vol. 76, No. 21, (May 2000),3043-3045.

Kim, Taeseok , et al., "Dielectric properties and strain analysis in paraelectric ZrTiO/sub 4/ thin films deposited by DC magnetron sputtering", *Japanese Journal of Applied Physics Part 1—Regular Papers Short Notes & Review Papers*, vol. 39, No. 7A, (2000),4153-4157.

Kim, Yongjo , et al., "Effect of microstructures on the microwave dielectric properties of ZrTiO/sub properties of ZrTiO/sub 4/ thin films", *Applied Physics Letters*, vol. 78, No. 16, (Apr. 2001),2363-2365.

Krauter, G. , et al., "Room Temperature Silicon Wafer Bonding with Ultra-Thin Polymer Films", *Advanced Materials*, 9(5), (1997),417-420.

Kukli, K J., et al., *J. Appl. Phys.*, 80, (2002),5698-5703.

Kukli, K , et al., *Thin Solid Films*, 416, (2002),72-79.

Kukli, Kaupo , et al., "Atomic Layer Deposition of Titanium Oxide TiI4 and H2O2", *Chem. Vap. Deposition*, vol. 6, No. 6, (2000),303-310.

Kukli, K , et al., "Controlled Growth of Yttrium Oxysulphide Thin Films by Atomic Layer Deposition", *Materials Science Forum*, (1999),216-221.

Kukli, Kaupo , et al., "Dielectric Properties of Zirconium Oxide Grown by Atomic Layer Deposition from Iodide Precursor", *Journal of the Electrochemical Society*, 148(12), (2001),F227-F232.

Kukli, K , et al., "Influence of thickness and growth temperature on the properties of zirconium oxide films growth by atomic layer deposition on silicon", *Thin Solid Films*, 410, (2002),53-60.

Lee, B H., et al., *Tech. Dig. Int. Electron Devices Meet.*, (2000),39.

Lee, S J., et al., *Tech. Dig. Int. Electron Devices Meet.*, 2000, (2000),31.

Lee, J H., et al., *Technical Digest of International Electron Devices Meeting 2002*, (2002),221-224.

Lee, A E., et al., "Epitaxially grown sputtered LaAlO3 films" *Appl. Phys. Lett. 57* (19), (Nov. 1990),2019-2021.

Lee, Cheng-Chung , et al., "Ion-assisted deposition of silver thin films", *Thin Solid Films*, 359,(2000),pp. 95-97.

Lee, Dong H., et al., "Metalorganic chemical vapor deposition of Tio2:n anatase thin film on Si substrate", *Applied Physics Letters*, (Feb. 1995),pp. 815-816.

Lee, L P., et al., "Monolithic 77 K dc SQUID magnetometer", *Appl. Phys. Lett. 59*(23), (Dec. 1991),3051-3053.

Lee, C. H., et al., "MOS Characteristics of Ultra Thin Rapid Thermal CVD ZrO2 and Zr Silicate Gate Dielectrics", *IEDM*, (2000),pp. 27-30.

Lee, C H., et al., "MOS Devices with High Quality Ultra Thin CVD ZrO2 Gate Dielectrics and Self-Aligned TaN and TaN/Poly-Si Gate electrodes", *2001 Symposium on VLSI, Technology Digest of Technical Papers*, (2001),137-138.

Lee, Byoung H., et al., "Ultrathin Hafnium Oxide with Low Leakage and Excellent Reliability for Alternative Gate Dielectric Application", *Technical-Digest of IEDM*, (1999),133-136.

Lucovsky, G , et al., "Microscopic model for enhanced dielectric constants in low concentration SiO2-rich noncrystalline Zr and Hf silicate alloys", *Applied Physics Letters*, (Oct. 2000),2912-2914.

Luo, Z J., et al., "Ultra-thin ZrO2 (or Silicate) with High Thermal Stability for CMOS GAte Applications", *2001 Symposium on VLSI Technology Digest of Technical Papers*, (2001),135-136.

Molodyk, A A., et al., "Volatile Surfactant-Assisted MOCVD: Application to LaAl03 Thin Film Growth", *Chem. Vap. Deposition* vol. 6, No. 3, (2000),133-138.

Molsa, Heini , et al., "Growth of Yttrium Oxide Thin Films from B-Diketonate Precursor", *Advanced Materials for Optics and Electronics*, (1994),389-400.

Nakagawara, Osamu , et al., "Electrical properties of (Zr, Sn)TiO4 dielectric thin film prepared by pulsed laser deposition", *J. Appl. Phys.*, 80(1), (Jul. 1996),388-392.

Nakajima, Anri , et al., "Atomic-layer deposition of ZrO/sub 2/ with a Si nitride barrier layer", *Applied Physics Letters*, vol. 81, No. 15, (Oct. 2002),2824-2826.

Nakajima, Anri , et al., "NH3-annealed atomic-layer-deposited silicon nitride as a high-k gate dielectric with high reliability", *Applied Physics Letters*, (Feb. 2002),1252-1254.

Neumayer, D A., et al., "Materials characterization of ZrO2-SiO2 and HfO2-SiO2 binary oxides deposited by chemical solution deposition", *Journal of Applied Physics*, (Aug. 2001),1801-1808.

Niilisk, A , et al., "Atomic-scale optical monitoring of the initial growth of TiO2 thin films", *Int. Soc. Opt. Eng.*, 431, (2001),72-77.

Oates, D E., et al., "Surface impedance measurements of YBa/sub 2/Cu/sub 3/O/sub 7-x/ thin films in stripline resonators", *IEEE Transactions on Magnetics*, vol. 27, No. 2, pt.2, (Mar. 1991),867-871.

Oh, C B., et al., *Technical Digest of International Electron Devices Meeting 2002*, (2002),423-426.

Park, J J., et al., *J. of the Electrochemical Soc.*, 149, (2002),G89-G94.

Park, Byung-Eun et al., "Electrical properties of LaAlO3/Si and Sr0.8Bi2.2Ta2O9/LaAlO3/Si structures" *Applied Physics Letters*, vol. 79, No. 6, (Aug. 2001),806-808.

Perkins, Charles M., et al., "Electrical and materials properties of ZrO2 gate dielectrics grown by atomic layer chemical vapor deposition", *Applied Physics Letters*, vol. 78, No. 16, (Apr. 2001),2357-2359.

Poveshchenko, V P., et al., *Sov. J. Opt. Technol.*, 51 (1984),277-279.

Qi, Wen-Jie , et al., "Performance of MOSFETs with ultra thin ZrO2 and Zr-silicate gate dielectrics", *2000 Symposium on VLSI Technology, Digest of Technical Papers*, (2000),40-41.

Ramakrishnan, E S., et al., "Dielectric Properties of Radio Frequency Magnetron Sputter Deposited Zirconium Titanate-Based Thin Films", *J. Electrochem. Soc.*, vol. 145, No. 1, (Jan. 1998),358-362.

Rayner Jr., G , et al., "The Structure of Plasma-Deposited and Annealed Pseudo-Binary ZrO2-SiO2 Alloys", *Material Res. Soc. Symp.*, (2000),C1.3.1-C1.3.9.

Ritala, Mikko , "Atomic Layer Epitaxy Growth of Titanium, Zirconium and Hafnium Dioxide Thin Films", *Annales Academiae Scientiarum Fennicae*, (1994),24-25.

Ritala, Mikko , et al., "Zirconium dioxide thin films deposited by ALE using zirconium tetrachloride as precursor", *Applied Surface Science*, vol. 75, (1994),333-340.

Robertson, J. , "Band offsets of wide-band-gap oxides and implications for future electronic devices", *Journal Vac. Sci. Technol. B*, 18(3), (2000),pp. 1785-1791.

Rossnagel, S M., et al., "Plasma-enhanced atomic layer deposition of Ta and Ti for Interconnect diffusion barriers", *J. Vac. Sci. & Techno.*, B, 18, (2000),2016-2020.

Rotondaro, A L., et al., "Advanced CMOS Transistors with a Novel HfSiON Gate Dielectric", *Symposium on VLSI Technology Digest of Technical Papers*, (2002),148-149.

Shanware, A , et al., "Reliability evaluation of HfSiON gate dielectric film with 12.8 A SiO2 equivalent thickness", *International Electron Devices Meeting*, (2001),137-140.

Sneh, Ofer , "Thin film atomic layer deposition equipment for semiconductor processing", *Thin Solid Films*, vol. 402, No. 1-2, (Jan. 2002),248-261.

Song, Hyun-Jung , et al., "Atomic Layer Deposition of Ta2O5 Films Using Ta(OC2H5)5 and NH3", *Mat. Res. Soc. Symp. Proc.*, (1999),469-471.

Suntola, T. , "Atomic Layer Epitaxy", *Handbook of Crystal Growth, 3; Thin Fils of Epitaxy, Part B: Growth Mechanics and Dynamics*, Amsterdam,(1994),pp. 602-663.

Suntola, T , "Atomic layer epitaxy", *Thin Solid Films*, 216, (1992),84-89.

Takemoto, J. H., et al., "Microstrip Resonators and Filters Using High-TC Superconducting Thin Films on LaAl0O" *IEEE Transaction on Magnetics*, vol. 27, No. 2, (Mar. 1991),2549-2552.

Tarre, A , et al., "Comparative study of low-temperature chloride atomic-layer chemical vapor deposition of TiO2 and SnO2", *Applied Surface Science*, (2001),111-116.

Tavel, B , et al., *Technical Digest of International Electron Devices Meetings 2002*, (2002),429-432.

Van Dover, R. B., et al., "Amorphous lanthanide-doped TiOx dielectric films", *Applied Physics Letters*, vol. 74, No. 20,(May 17, 1999),pp. 3041-3043.

Van Dover, Robert B., et al., "Deposition of Uniform Zr-Sn-Ti-O films by ON-Axis Reactive Sputtering",*IEEE Electron Device Letters*, vol. 19. No. 9, (Sep. 1998),329-331.

Van Dover, R. B., et al., "Discovery of a useful thin-film dielectric using a composition-spread approach", *Letters to Nature*, (1997),3 pages.

Viirola, H., et al., "Controlled growth of antimony-doped tin dioxide thin films by atomic layer epitaxy", *Thin Solid Films*, (1994),127-135.

Viirola, H., "Controlled growth of tin oxide thin films by atomic layer epitaxy", *Thin Solid Films*, (1994),144-149.

Visokay, M R., et al., "Application of HfSiON as a gate dielectric material", *Applied Physics Letters*, (Apr. 2002),3183-3185.

Von Dover, R B., et al., "Deposition of Uniform Zr-Sn-Ti-O Films by On-Axis Reactive Sputtering", *IEEE Electron Device Letters*, 19 (1998).

Wilk, G D., et al., "Hafnium and zirconium silicates for advanced gate dielectrics", *Journal of Applied Physics*, (Jan. 2000),484-492.

Wilk, G. D., et al., "High-K gate dielectrics: Current status and materials properties considerations", *J. Appl. Phys.*, vol. 89, No. 10, (May 2001),5243-5275.

Wolfman, G., et al., "Existence range, structural and dielectric properties of ZrxTiySnzO4 ceramics (x+y=2)", *Mat. Res. Bull.*, 16, (1981),1455.

Yamaguchi, Takeshi, et al., "Band Diagram and Carrier Conduction Mechanism in ZrO2/Zr-silicate/Si MIS Structure Fabricated by Pulsed-laser-ablation Deposition", *IEDM*, (2000),19-22.

Yamaguchi, Takeshi, et al., "Study on Zr-Silicate Interfacial Layer of ZrO2-MIS Structure FAbricated by Pulsed Laser Ablation Deposition Method", *Solid State Devices and Materials*, (2000),228-229.

Zhang, H., "Atomic Layer Deposition of High Dielectric Constant Nanolaminates" *Journal of the Electrochemical Society*, 148(4),(Apr. 2001),F63-F66.

Zhang, H., et al., "High permittivity thin film nanolaminates", *Journal of Applied Physics*, vol. 87, No. 4, (Feb. 2000),1921-1924.

Zhu, W, et al., "HfO2 and HfAlO for CMOS: Thermal Stability and Current Tranport", *IEEE International Electron Device Meeting 2001*, (2001),463-466.

Zucker, O, et al., "Application of Oxygen Plasma Processing to Silicon Direct Bonding", *Sensors and Actuators A*, 36, (1993),227-231.

Chin, A., et al., "High Quality La2O3 and Al2O3 Gate Dielectrics with Equivalent Oxide Thickness 5-10A", *Digest of Technical Papers. 2000 Symposium on VLSI Technology*, 2000, Honolulu, (Jun. 13-15, 2000), 16-17.

Copel, M., et al., "Formation of a stratified lanthanum silicate dielectric by reaction with Si(001)", *Applied Physics Letters*, 78(11), (Mar. 12, 2001), 1607-1609.

Dimoulas, A., et al., "Structural and electrical quality of the high-k dielectric Y2O3 on Si (001): Dependence on growth parameters", *Journal of Applied Physics*, 92(1), (Jul. 1, 2002), 426-431.

Guha, S, et al., "Atomic beam deposition of lanthanum-and yttrium-based oxide thin films for gate dielectrics", *Applied Physics Letters*, 77, (2000), 2710-2712.

Guha, S., et al., "High temperature stability of Al2O3 dielectrics on Si: Interfacial metal diffusion and mobility degradation", *Applied Physics Letters*, vol. 81, No. 16, (Oct. 14, 2002), 2956-2958.

Huang, C. H., et al., "La/sub 2/O/sub 3//Si/sub 0.3/Ge/sub 0.7/ p-MOSFETs with high hole mobility and good device characteristics", *IEEE Electron Device Letters*, 23(12), (Dec. 2002), 710-712.

Iwai, H., et al., "Advanced gate dielectric materials for sub-100 nm CMOS", *International Electron Devices Meeting, 2002. IEDM '02. Digest.*, (Dec. 8-11, 2002), 625-628.

Ko, Myoung-Gyun, et al., "High density plasma enhanced atomic layer deposition of lanthanum oxide for high-k gate oxide material", *207th Meeting of the Electrochemical Society*, (May 2005), 1 page.

Maria, J. P., et al., "High temperature stability in lanthanum and zirconia-based gate dielectrics", *Journal of Applied Physics*, 90(7), (Oct. 1, 2001), 3476-3482.

Michaelson, Herbert B., "The work function of the elements and its periodicity", *Journal of Applied Physics*, 48(11), (Nov. 1977), 4729-4733.

Shimizu, Takashi, et al., "Electrical Properties of Ruthenium/ Metalorganic Chemical Vapor Deposited La-Oxide/Si Field Effect Transistors", *Jpn. J. Appl. Phys.*, vol. 42, Part 2, No. 11A, (2003), L1315-L1317.

Yamada, Hirotoshi, et al., "MOCVD of High-Dielectric-Constant Lanthanum Oxide Thin Films", *Journal of The Electrochemical Society*, 150(8), (Aug. 2003), G429-G435.

Zhong, Huicai, et al., "Electrical Properties of Ru and RuO2 Gate Electrodes for Si-PMOSFET with ZrO2 and Zr-Silicate Dielectrics", *Journal of Electronic Materials*, 30(12), (Dec. 2001), 1493.

"Praseodymium Oxide, Pr2O3 for Optical Coating", *Technical Publication by CERAC about Praseodymium Oxide*, http://www.cerac.com/pubs/proddata/pr2o3.htm, (Sep. 21, 2005), 1-2.

Iwamoto, K., et al., "Advanced Layer-By-Layer Deposition and Annealing Process for High-Quality High-K Dielectrics Formation", *Electrochemical Society Proceedings* vol. 2003 (14), (2003),265-272.

Nakajima, et al., "Atomic-layer-deposited silicon-nitride/SiO2 stacked gate dielectrics for highly reliable p-metal-oxide-semiconductor filed-effect transistors", *Applied Physics Letters*, vol. 77, (Oct. 2000),2855-2857.

Ahn, Kie Y., "Atomic Layer Deposited Lanthanum Hafnium Oxide Dielectrics", U.S. Appl. No. 11/010,529, filed Dec. 13, 2004.

Ahn, Kie Y., "Cobalt Titanium Oxide Dielectric Films",U.S. Appl. No. 11/216,958, filed Aug. 31, 2005.

Ahn, Kie Y., "Gallium Lanthanide Oxide Films (working title)", (U.S. Appl. No. 11/329,025.

Ahn, Kie Y., "Lanthanum Aluminum Oxynitride Dielectric Films", U.S. Appl. No. 11/216,474, filed Aug. 31, 2005.

Ahn, Kie Y., "Zirconium-Doped Gadolinium Oxide Films", U.S. Appl. No. 11/215,578, filed Aug. 29, 2005.

Kraus, Brenda, "Conductive Nanoparticles", U.S. Appl. No. 11/197,184, filed Aug. 4, 2005.

Van Dover, R B., "Amorphous lanthanide-doped TiOx dielectric films", *Applied Physics Letters*, 74(20), (May 1999),3041-3043.

U.S. Appl. No. 10/219,870 Non-final office action mailed Oct. 8, 2003, 14 pgs.

U.S. Appl. No. 10/219,870 Notice of allowance mailed Apr. 9, 2004, 3 pgs.

U.S. Appl. No. 10/219,870 Notice of allowance mailed Sep. 28, 2004, 4 pgs.

U.S. Appl. No. 10/219,870 Response filed Jan. 8, 2004 to non-final office action mailed Oct. 8, 2003, 20 pgs.

U.S. Appl. No. 10/765,619 Amendment under 37 C.F.R. 1.312 filed Oct. 27, 2005, 9 pgs.

U.S. Appl. No. 10/863,953 Amendment under 37 C.F.R. 1.312 filed Feb. 6, 2007, 7 pgs.

U.S. Appl. No. 10/931,364 non-final office action mailed Jun. 30, 2005, 10 pgs.

U.S. Appl. No. 10/931,364 Notice of allowance mailed Nov. 3, 2005, 4 pgs.

U.S. Appl. No. 10/931,364 Response filed Sep. 30, 2005 to non-final office action mailed Jun. 30, 2005, 11 pgs.

U.S. Appl. No. 11/031,289 non-final office action mailed Oct. 20, 2006, 5 pgs.

U.S. Appl. No. 11/031,289 Response filed Jan. 22, 2007 to non-final office action mailed Oct. 20, 2006, 13 pgs.

Final office action mailed Jan. 28, 2003 in U.S. Appl. No. 09/944,981, 9 pgs.

Final office action mailed Feb. 26, 2003 in U.S. Appl. No. 10/052,983, 14 pgs.

Final office action mailed Apr. 19, 2005 in U.S. Appl. No. 10/765,619, 14 pgs.

Final office action mailed May 7, 2003 in U.S. Appl. No. 09/944,981, 11 pgs.

Non-final office action mailed Oct. 20, 2005 in U.S. Appl. No. 10/930,184, 25 pgs.

Non-final office action mailed Oct. 22, 2002 in U.S. Appl. No. 10/052,983, 18 pgs.

Non-final office action mailed Mar. 18, 2004 in U.S. Appl. No. 09/944,981, 8 pgs.

Non-final office action mailed Apr. 27, 2006 in U.S. Appl. No. 10/863,953, 32 pgs.

Non-final office action mailed May 22, 2003 in U.S. Appl. No. 10/027,315, 8 pgs.

Non-final office action mailed May 5, 2006 in U.S. Appl. No. 10/930,184, 11 pgs.

Non-final office action mailed Aug. 12, 2002 in U.S. Appl. No. 09/944,981, 7 pgs.

Non-final office action mailed Sep. 28, 2005 in U.S. Appl. No. 10/768,597, 20 pgs.
Notice of allowance mailed Aug. 23, 2004 in U.S. Appl. No. 10/027,315, 8 pgs.
Notice of allowance mailed Jan. 27, 2006 in U.S. Appl. No. 10/768,597, 8 pgs.
Notice of allowance mailed Oct. 22, 2003 in U.S. Appl. No. 10/027,315, 9 pgs.
Notice of allowance mailed Dec. 6, 2006 in U.S. Appl. No. 10/930,184, 21 pgs.
Non-Final Office Action mailed Dec. 10, 2004 in U.S. Appl. No. 10/765,619, 13 pgs.
Notice of allowance mailed Feb. 25, 2004 in U.S. Appl. No. 10/052,983, 5 pgs.
Notice of allowance mailed May 20, 2003 in U.S. Appl. No. 10/052,983, 6 pgs.
Notice of allowance mailed Jul. 14, 2004 in U.S. Appl. No. 09/944,981, 22 pgs.
Notice of allowance mailed Aug. 5, 2005 in U.S. Appl. No. 10/765,619, 7 pgs.
Notice of allowance mailed Sep. 23, 2003 in U.S. Appl. No. 10/052,983, 7 pgs.
Response filed Jan. 20, 2006 to office action mailed Oct. 20, 2005 in U.S. Appl. No. 10/930,184, 20 pgs.
Response filed Jan. 22, 2003 to non-final office action mailed Oct. 22, 2002 in U.S. Appl. No. 10/052,983, 24 pgs.
Response filed Nov. 12, 2002 to final office action mailed Aug. 12, 2002 in U.S. Appl. No. 09/944,981, 17 pgs.
Response filed Dec. 28, 2005 to non-final office action mailed Sep. 28, 2005 in U.S. Appl. No. 10/768,597, 25.
Response filed Feb. 22, 2005 to non-final office action mailed Dec. 10, 2004 in U.S. Appl. No. 10/765,619, 23 pgs.
Response filed Apr. 2, 2003 to final office action mailed Jan. 28, 2003 in U.S. Appl. No. 09/944,981, 11 pgs.
Response filed Apr. 28, 2003 to final office action mailed Feb. 26, 2003 in U.S. Appl. No. 10/052,983, 14 pgs.
Response filed Jun. 18, 2004 to office action mailed Mar. 18, 2004 in U.S. Appl. No. 09/944,981, 30 pgs.
Response filed Jun. 20, 2005 to final office action mailed Apr. 19, 2005 in U.S. Appl. No. 10/765,619, 17 pgs.
Response filed Jul. 7, 2003 to final office action mailed May 7, 2003 in U.S. Appl. No. 09/944,981, 13 pgs.
Response filed Aug. 22, 2003 to non-final office action mailed May 22, 2003 in U.S. Appl. No. 10/027,315, 22 pgs.
Response filed Aug. 28, 2006 to non-final office action mailed Apr. 27, 2006 in U.S. Appl. No. 10/863,953, 18 pgs.
Response filed Sep. 5, 2006 to office action mailed May 5, 2006 in U.S. Appl. No. 10/930,184, 19 pgs.
Ahn, et al., "ALD of Zr-Substituted BaTiO3 Films as Gate Dielectrics", U.S. Appl. No. 11/498,559, filed Aug. 3, 2006 Client Ref No. 06-0094.
Ahn, K Y., "Atomic Layer Deposited Barium Strontium Titanium Oxide Films", U.S. Appl. No. 11/510,803, filed Aug. 26, 2006.
Ahn, Kie Y., "Atomic Layer Deposition of GDSCO3 Films as Gate Dielectrics", U.S. Appl. No. 11/215,507, filed Aug. 30, 2005, 05-0665.
Ahn, Kie Y., et al., "Hafnium Lanthanide Oxynitride Films", U.S. Appl. No. 11/515,143, filed Aug. 31, 2006 (client ref No. 06-0077).
Ahn, Kie Y., "Magnesium-Doped Zinc Oxide Structures and Methods", U.S. Appl. No. 11/706,820, filed Feb. 13, 2007; Client ref No. 06-0979).
Ahn, Kie Y., et al., "Methods to Form Dielectric Structures in Semiconductor Devices and Resulting Devices", U.S. Appl. No. 11/581,675, filed Aug. 16, 2006, (Client ref 06-0234).
Ahn, Kie Y., "Molybdenum-Doped Indium Oxide Structures and Methods", U.S. Appl. No. 11/706,944, filed Feb. 13, 2007, (Client Ref No. 06-1115.00).
Ahn, Kie Y., et al., "Tungsten-Doped Indium Oxide Structures and Methods", U.S. Appl. No. 11/706,498, filed Feb. 13, 2007 (client ref No. 06-06-0912).
Ahn, Kie Y., et al., "Zirconium-Doped Zinc Oxide Structures and Methods", U.S. Appl. No. 11/707,173, filed Feb. 13, 2007 (client ref No. 06-0853).

Forbes, "Hafnium Aluminium Oxynitride High-K Dielectric and Metal Gates", U.S. Appl. No. 11/514,558, filed Aug. 31, 2006 (client ref No. 06-0075).
Forbes, "Hafnium Tantalum Oxynitride High-K Dielectric and Metal Gates", U.S. Appl. No. 11/515,114, filed Aug. 31, 2005, client ref No. 06-0073.
Forbes, Leonard, et al., "Silicon Lanthanide Oxynitride Films", U.S. Appl. No. 11/514,533, filed Aug. 31, 2006 (client ref No. 06-0105).
Forbes, et al., "Tantalum Aluminum Oxynitride High-K Dielectric and Metal Gates", U.S. Appl. No. 11/514,655, filed Aug. 31, 2006 (client ref No. 06-0085).
Forbes, Leonard et al., "Tantalum Silicon Oxynitride High-K Dielectrics and Metal Gates", U.S. Appl. No. 11/514,601, filed Aug. 31, 2006 (client ref No. 06-0108).
Morais, J., et al., "Composition, atomic transport, and chemical stability of ZrAlxOy ultrathin films deposited on Si(001)", *Applied Physics Letters*, 79(13), (Sep. 24, 2001),1998-2000.
Nalwa, H. S., "Handbook of Thin Film Materials", *Deposition and Processing of thin Films*, vol. 1, San Diego : Academic Press,(2002),114-119.
Nieminen, Minna, et al., "Growth of gallium oxide thin films from gallium acetylacetonate by atomic layer deposition", *J. Mater. Chem.*, 6(1), (1996),27-31.
Xiao, et al., "Deposition of hard mental nitride-like coatings in an electro cyclotron resonance discharge", *Elsevier*, (Sep. 13, 2003),389-393.
*International Technology for Semiconductor Roadmap*, (1999).
Bright, A A., et al., "Low-rate plasma oxidation of Si in a dilute oxygen/helium plasma for low-temperature gate quality Si/Sio2 interfaces", *Applied Physics Letters*, (Feb. 1991), pp. 619-621.
Cheng, Baohong, et al., "The Impact of High-k Gate Dielectrics and Metal Gate Electrodes on Sub-100nm MOSFET's", *IEEE Transactions on Electron Devices*, (1999), pp. 1537-1544.
Fuyuki, Takashi, et al., "Initial stage of ultra-thin SiO2 formation at low temperatures using activated oxygen", *Applied Surface Science*, (1997), pp. 123-126.
Hirayama, Masaki, et al., "Low-Temperature Growth of High-Integrity Silicon Oxide Films by Oxygen Radical Generated in High Density Krypton Plasma", *IEDM Technical Digest*, (1999), pp. 249-252.
Hubbard, K. J., et al., "Thermodynamic stability of binary oxides in contact with silicon", *J. Mater. Res.*, (Nov. 1996), pp. 2757-2776.
Jeong, Chang-Wook, et al., "Plasma-Assisted Atomic Layer Growth of High-Quality Aluminum Oxide Thin Films", *Japanese Journal of Applied Physics*, (Jan. 2001), pp. 285-289.
Kawai, Y, et al., "Ultra-low-temperature growth of high-integrity gate oxide films by low-energy Ion-assisted oxidation", *Applied Physics Letters*, (Apr. 1994), pp. 2223-2225.
Kim, C T., et al., "Application of Al2O3 Grown by Atomic Layer Deposition to DRAM and FeRAM", *International Symposium in Integrated Ferroelectrics*, (Mar. 2000), pp. 316.
Kim, Y, et al., "Substrate dependence on the optical properties of Al2O3 films grown by atomic layer deposition", *Applied Physics Letters*, (Dec. 1997), pp. 3604-3606.
Leskela, M, et al., "ALD precursor chemistry: Evolution and future challenges", *Journal de Physique*, (1999), pp. 837-852.
Liu, C. T., "Circuit Requirement and Integration Challenges of Thin Gate Dielectrics for Ultra Small MOSFETs", *IEDM*, (1998), pp. 747-750.
Liu, Y C., et al., "Growth of ultrathin SiO2 on Si by surface irradiation with an O2+Ar electron cyclotron resonance microwave plasma at low temperatures", *Journal of Applied Physics*, (Feb. 1999), pp. 1911-1915.
Martin, P J., et al., "Ion-beam-assisted deposition of thin films", *Applied Optics*, (Jan. 1983), pp. 178-184.
Muller, D. A., et al., "The electronic structure at the atomic scale of ultrathin gate oxides", *Nature*, vol. 399, No. 6738, Jun. 24, 1999, (1999), pp. 758-761.
Nieminen, Minna, et al., "Formation and stability of lanthanum oxide thin films deposited from B-diketonate precursor", *Applied Surface Science*, (2001), pp. 155-165.
Osten, H. J., et al., "High-k Gate Dielectrics with Ultra-low Leakage Current Based on Praseodymium Oxide", *IEEE*, (2000), pp. 653-656.

Pan, Tung M., et al., "High Quality Ultrathin CoTiO3 High-k Gate Dielectrics", *Electrochemical and Solid-State Letters*, (2000), pp. 433-434.

Pan, Tung M., et al., "High-k cobalt-titanium oxide dielectrics formed by oxidation of sputtered Co/Ti or Ti/Co films", *Applied Physics Letters*, (Mar. 2001), pp. 1439-1441.

Qi, Wen-Jie, et al., "MOSCAP and MOSFET characteristics using ZrO2 gate dielectric deposited directly on Si", *IEDM Technical Digest*, (1999), pp. 145-148.

Saito, Yuji, et al., "Advantage of Radical Oxidation for Improving Reliability of Ultra-Thin Gate Oxide", *2000 Symposium on VLSI Technology Digest of Technical Papers*, (2000), pp. 176-177.

Saito, Yuji, et al., "High-Integrity Silicon Oxide Grown at Low-Temperature by Atomic Oxygen Generated in High-Density Krypton Plasma", *Extended Abstracts of the 1999 International Conference on Solid State Devices and Materials*, (1999), pp. 152-153.

Shin, Chang H., et al., "Fabriation and Characterization of MFISFET using Al2O3 Insulating Layer for Non-Volatile Memory", *12th International Symposium in Integrated Ferroelectrics*, (Mar. 2000), pp. 1-9.

Sze, S M., *Physics of Semiconductor Devices*, (1981), p. 431.

Sze, S M., *Physics of Semiconductor Devices*, (1981), p. 473.

Wolf, Stanley, et al., "Silicon Processing for the VLSI Era—vol. I: Process Technology", *Second Edition, Lattice Press*, Sunset Beach, California,(2000), p. 443.

\* cited by examiner

HIGHLY RELIABLE AMORPHOUS HIGH-K GATE OXIDE ZRO2

FIELD OF THE INVENTION

The invention relates to semiconductor devices and device fabrication. Specifically, the invention relates to gate oxide layers of transistor devices and their method of fabrication.

BACKGROUND OF THE INVENTION

In the semiconductor device industry, particularly in the fabrication of transistors, there is continuous pressure to reduce the size of devices such as transistors. The ultimate goal is to fabricate increasingly smaller and more reliable integrated circuits (ICs) for use in products such as processor chips, mobile telephones, or memory devices such as DRAMs. The smaller devices are frequently powered by batteries, where there is also pressure to reduce the size of the batteries, and to extend the time between battery charges. This forces the industry to not only design smaller transistors, but to design them to operate reliably with lower power supplies.

A common configuration of a transistor is shown in FIG. 1. While the following discussion uses FIG. 1 to illustrate a transistor from the prior art, one skilled in the art will recognize that the present invention could be incorporated into the transistor shown in FIG. 1 to form a novel transistor according to the invention. The transistor 100 is fabricated in a substrate 110 that is typically silicon, but could be fabricated from other semiconductor materials as well. The transistor 100 has a first source/drain region 120 and a second source/drain region 130. A body region 132 is located between the first source/drain region and the second source/drain region, the body region 132 defining a channel of the transistor with a channel length 134. A gate dielectric, or gate oxide 140 is located on the body region 132 with a gate 150 located over the gate oxide. Although the gate dielectric can be formed from materials other than oxides, the gate dielectric is typically an oxide, and is commonly referred to as a gate oxide. The gate may be fabricated from polycrystalline silicon (polysilicon) or other conducting materials such as metal may be used.

In fabricating transistors to be smaller in size and reliably operating on lower power supplies, one important design criteria is the gate oxide 140. A gate oxide 140, when operating in a transistor, has both a physical gate oxide thickness and an equivalent oxide thickness (EOT). The equivalent oxide thickness quantifies the electrical properties, such as capacitance, of a gate oxide 140 in terms of a representative physical thickness. EOT is defined as the thickness of a theoretical $SiO_2$ layer that describes the actual electrical operating characteristics of the gate oxide 140 in the transistor 100. For example, in traditional $SiO_2$ gate oxides, a physical oxide thickness may be 5.0 nm, but due to undesirable electrical effects such as gate depletion, the EOT may be 6.0 nm. A gate oxide other than $SiO_2$ may also be described electrically in terms of an EOT. In this case, the theoretical oxide referred to in the EOT number is an equivalent $SiO_2$ oxide layer. For example, $SiO_2$ has a dielectric constant of approximately 4. An alternate oxide with a dielectric constant of 20 and a physical thickness of 100 nm would have an EOT of approximately 20 nm (100*(4/20)), which represents a theoretical $SiO_2$ gate oxide.

Lower transistor operating voltages and smaller transistors require thinner equivalent oxide thicknesses (EOTs). A problem with the increasing pressure of smaller transistors and lower operating voltages is that gate oxides fabricated from $SiO_2$ are at their limit with regards to physical thickness and EOT. Attempts to fabricate $SiO_2$ gate oxides thinner than today's physical thicknesses show that these gate oxides no longer have acceptable electrical properties. As a result, the EOT of a $SiO_2$ gate oxide 140 can no longer be reduced by merely reducing the physical gate oxide thickness.

Attempts to solve this problem have led to interest in gate oxides made from oxide materials other than $SiO_2$. Certain alternate oxides have a higher dielectric constant (k), which allows the physical thickness of a gate oxide 140 to be the same as existing $SiO_2$ limits or thicker, but provides an EOT that is thinner than current $SiO_2$ limits.

A problem that arises in forming an alternate oxide layer on the body region of a transistor is the process in which the alternate oxide is formed on the body region. Recent studies show that the surface roughness of the body region has a large effect on the electrical properties of the gate oxide, and the resulting operating characteristics of the transistor. The leakage current through a physical 1.0 nm gate oxide increases by a factor of 10 for every 0.1 increase in the root-mean-square (RMS) roughness. In forming an alternate oxide layer on the body region of a transistor, a thin layer of the alternate material to be oxidized (typically a metal) must first be deposited on the body region. Current processes for depositing a metal or other alternate layer on the body region of a transistor are unacceptable due to their effect on the surface roughness of the body region.

FIG. 2a shows a surface 210 of a body region 200 of a transistor. The surface 210 in the Figure has a high degree of smoothness, with a surface variation 220. FIG. 2b shows the body region 200 during a conventional sputtering deposition process stage. During sputtering, particles 230 of the material to be deposited bombard the surface 210 at a high energy. When a particle 230 hits the surface 210, some particles adhere as shown by particle 235, and other particles cause damage as shown by pit 240. High energy impacts can throw off body region particles 215 to create the pits 240. A resulting layer 250 as deposited by sputtering is shown in FIG. 2c. The deposited layer/body region interface 255 is shown following a rough contour created by the sputtering damage. The surface of the deposited layer 260 also shows a rough contour due to the rough interface 255.

In a typical process of forming an alternate material gate oxide, the deposited layer 250 is oxidized to convert the layer 250 to an oxide material. Existing oxidation processes do not, however, repair the surface damage created by existing deposition methods such as sputtering. As described above, surface roughness has a large influence on the electrical properties of the gate oxide and the resulting transistor.

What is needed is an alternate material gate oxide that is more reliable at existing EOTs than current gate oxides. What is also needed is an alternate material gate oxide with an EOT thinner than conventional $SiO_2$. What is also needed is an alternative material gate oxide with a smooth interface between the gate oxide and the body region. Because existing methods of deposition are not capable of providing a smooth interface with an alternate material gate oxide, what is further needed is a method of forming an alternate material gate oxide that maintains a smooth interface.

Additionally, at higher process temperatures, any of several materials used to fabricate the transistor, such as silicon, can react with other materials such as metals or oxygen to form unwanted silicides or oxides. What is needed is a lower temperature process of forming gate oxides that prevents the formation of unwanted byproduct materials.

SUMMARY OF THE INVENTION

A method of forming a gate oxide on a surface such as a transistor body region is shown where a metal layer is deposited by thermal evaporation on the body region, the metal being chosen from a group consisting of the group IVB elements of the periodic table. The metal layer is then oxidized to convert the metal layer to a gate oxide. In one embodiment, the metal layer includes zirconium (Zr). One embodiment of the invention uses an electron beam source to evaporate the metal layer onto the body region of the transistor. The oxidation process in one embodiment utilizes a krypton (Kr)/oxygen ($O_2$) mixed plasma process.

In addition to the novel process of forming a gate oxide layer, a transistor formed by the novel process exhibits novel features that may only be formed by the novel process. Thermal evaporation deposition of a metal layer onto a body region of a transistor preserves an original smooth surface roughness of the body region in contrast to other prior deposition methods that increase surface roughness. The resulting transistor fabricated with the process of this invention will exhibit a gate oxide/body region interface with a surface roughness variation as low as 0.6 nm.

These and other embodiments, aspects, advantages, and features of the present invention will be set forth in part in the description which follows, and in part will become apparent to those skilled in the art by reference to the following description of the invention and referenced drawings or by practice of the invention. The aspects, advantages, and features of the invention are realized and attained by means of the instrumentalities, procedures, and combinations particularly pointed out in the appended claims.

BRIEF DESCRIPTION OF THE DRAWINGS

FIG. 3b shows a magnified view of a deposited film on a body region from FIG. 3a.

DETAILED DESCRIPTION OF THE PREFERRED EMBODIMENTS

Figure 1:
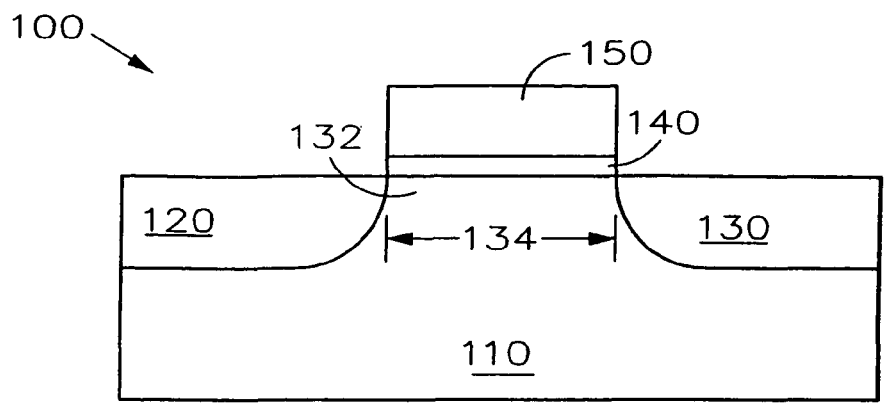
FIG. 1 shows a common configuration of a transistor.

In the following detailed description of the invention, reference is made to the accompanying drawings which form a part hereof, and in which is shown, by way of illustration, specific embodiments in which the invention may be practiced. In the drawings, like numerals describe substantially similar components throughout the several views. These embodiments are described in sufficient detail to enable those skilled in the art to practice the invention. Other embodiments may be utilized and structural, logical, and electrical changes may be made without departing from the scope of the present invention. The terms wafer and substrate used in the following description include any structure having an exposed surface with which to form the integrated circuit (IC) structure of the invention. The term substrate is understood to include semiconductor wafers. The term substrate is also used to refer to semiconductor structures during processing, and may include other layers that have been fabricated thereupon. Both wafer and substrate include doped and undoped semiconductors, epitaxial semiconductor layers supported by a base semiconductor or insulator, as well as other semiconductor structures well known to one skilled in the art. The term conductor is understood to include semiconductors, and the term insulator or dielectric is defined to include any material that is less electrically conductive than the materials referred to as conductors.

The term "horizontal" as used in this application is defined as a plane parallel to the conventional plane or surface of a wafer or substrate, regardless of the orientation of the wafer or substrate. The term "vertical" refers to a direction perpendicular to the horizonal as defined above. Prepositions, such as "on", "side" (as in "sidewall"), "higher", "lower", "over" and "under" are defined with respect to the conventional plane or surface being on the top surface of the wafer or substrate, regardless of the orientation of the wafer or substrate. The following detailed description is, therefore, not to be taken in a limiting sense, and the scope of the present invention is defined only by the appended claims, along with the full scope of equivalents to which such claims are entitled.

Figure 3A:
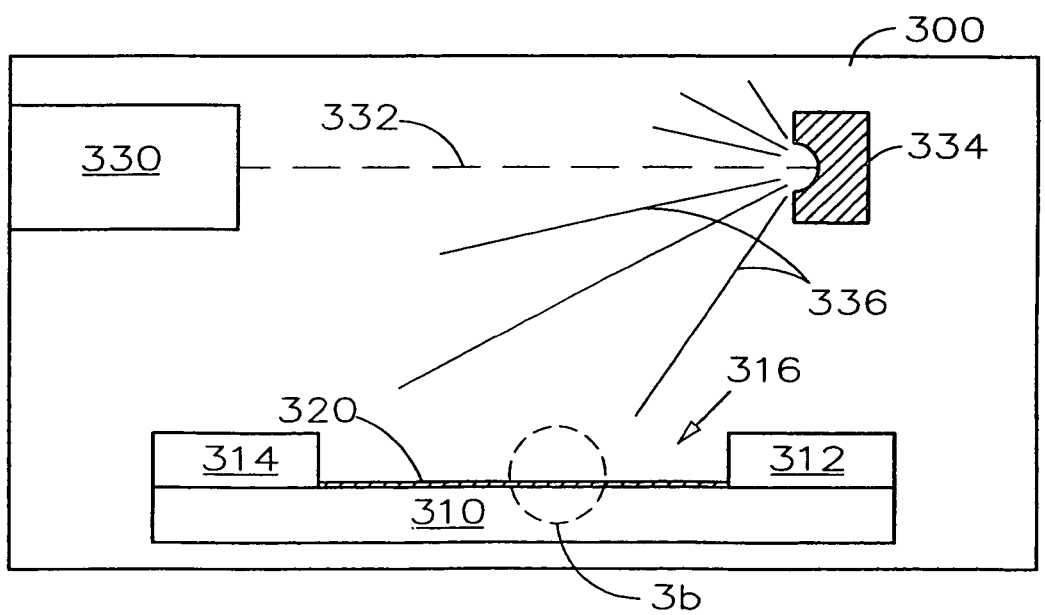
FIG. 3a shows a deposition process according to the invention.

FIG. 3a shows an electron beam evaporation technique to deposit a material on a surface such as a body region of a transistor. In FIG. 3a, a substrate 310 is placed inside a deposition chamber 300. The substrate in this embodiment is masked by a first masking structure 312 and a second masking structure 314. In this embodiment, the unmasked region 316 includes a body region of a transistor, however one skilled in the art will recognize that other semiconductor device structures may utilize this process. Also located within the deposition chamber 300 is an electron beam source 330, and a target material 334. Although in this embodiment, an electron beam evaporation technique is used, it will be apparent to one skilled in the art that other thermal evaporation techniques can be used without departing from the scope of the invention. During the evaporation process, the electron beam source 330 generates an electron beam 332. The electron beam hits the target material 334 and heats a portion of the target material enough to cause the surface of the target material to evaporate. The evaporated material 336 is then distributed throughout the chamber 300, and the material 336 deposits on surfaces that it contacts, such as the exposed body region 316. The depositing material builds up to form a layer 320 of material that is chemically the same as the target material 334.

In one embodiment of the invention, the deposited material layer 320 includes a pure metal layer chosen from the alkaline earth metals in group IVB of the periodic table. In one embodiment of the invention, the deposited material layer 320 includes zirconium (Zr). In one embodiment of the invention, the target material is a 99.9999% pure slug of zirconium. The choice of material is based on the properties of the oxide formed. Considerations included the thermodynamic stability of the oxide with silicon, the diffusion coefficient of the oxide at high processing temperatures such as 1000° K, the lattice match of the oxide with silicon, the dielectric constant of the oxide, and the conduction band offset of the oxide. In one embodiment, the conduction band offset of the metal oxide formed is in a range of approximately 5.16 eV to 7.8 eV. In one embodiment, the deposited material layer 320 is substantially amorphous. A lower presence of grain boundaries in the substantially amorphous material layer 320 reduces the leakage current through the final gate oxide. Although the amorphous form is preferred, the material chosen for oxidation, such as zirconium is also acceptable in its crystalline form.

Figure 2A:
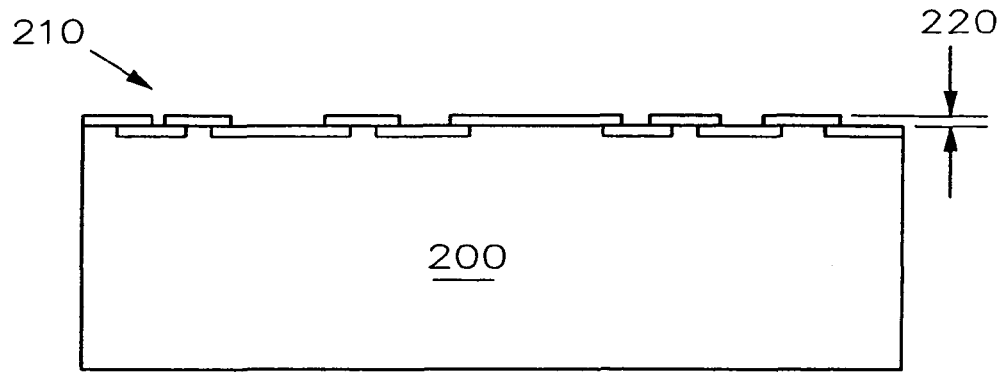
FIG. 2a shows a smooth surface of a body region of a transistor.
Figure 2B:
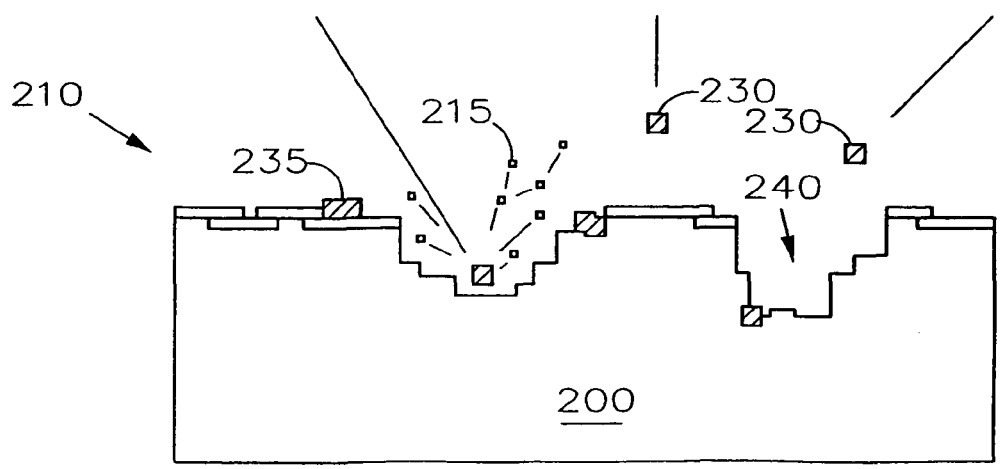
FIG. 2b shows a deposition process according to the prior art.
Figure 2C:
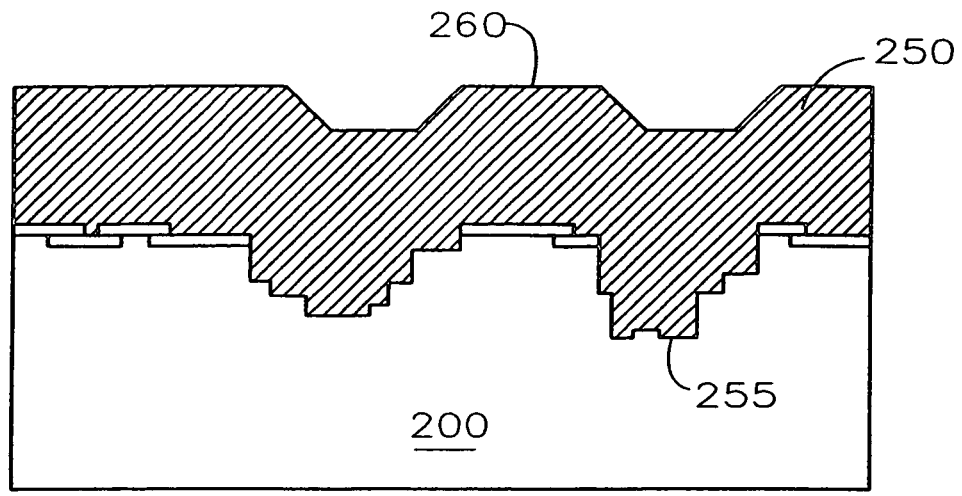
FIG. 2c shows a deposited film on a body region according to the prior art.

A thermal evaporation process such as the electron beam evaporation technique described above does not cause the surface damage that is inherent in other deposition techniques such as the sputtering technique shown in FIG. 2b. This allows a very thin layer of material to be deposited on a body region of a transistor, while maintaining a smooth interface. A thermal evaporation process such as the electron beam evaporation technique described above also allows low processing temperatures that inhibit the formation of unwanted byproducts such as silicides and oxides. In one embodiment, the thermal evaporation is performed with a substrate temperature between approximately 150 and 200° C.

Figure 3B:
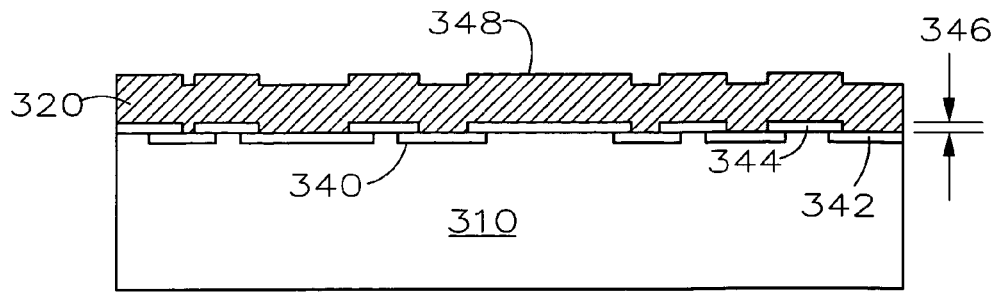

FIG. 3b shows a magnified view of the body region 316 and the deposited layer 320 from FIG. 3a. The interface 340 is shown with a roughness variation 346. The deposited layer surface 348 is also shown with a similar surface roughness. One possible surface variation 346 would be an atomic layer variation. In atomic smoothness, the greatest difference in surface features is between a first atomic layer as indicated by layer 342 and a second atomic layer 344. The thermal evaporation deposition technique described above preserves atomic smoothness such as is shown in FIG. 3b, however other acceptable levels of surface roughness greater than atomic smoothness will also be preserved by the thermal evaporation technique.

Figure 4A:
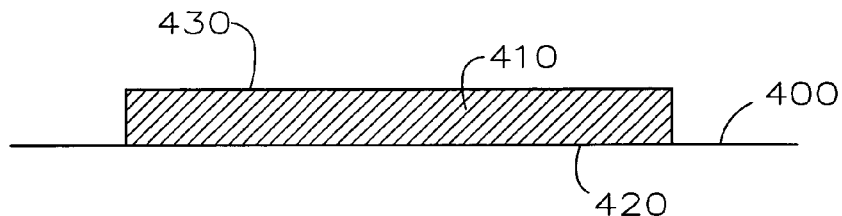
FIG. 4a shows a deposited film on a body region according to the invention.
Figure 4B:
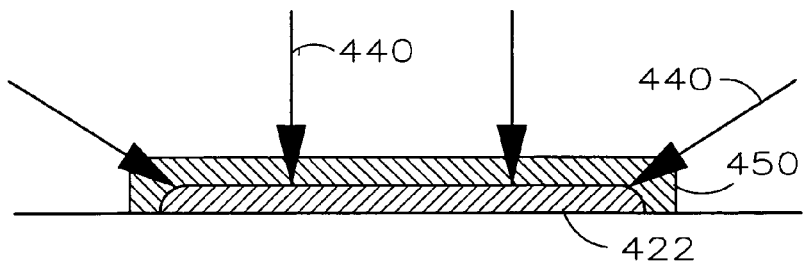
FIG. 4b shows a partially oxidized film on a body region according to the invention.
Figure 4C:
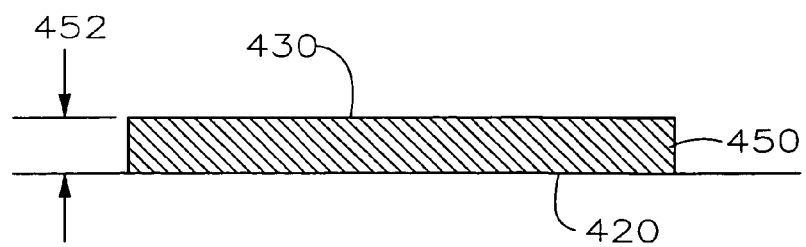
FIG. 4c shows a completely oxidized film on a body region according to the invention.

FIGS. 4a-4c show a low temperature oxidation process that is used in one embodiment to convert the deposited layer 320 into a gate oxide. A deposited material layer 410 is shown in FIG. 4a on a substrate surface 400. The layer 410 forms an interface 420 with the substrate surface 400, and the layer 410 has an outer surface 430. The layer 410 in this embodiment is deposited over a body region of a transistor, however the layer may be deposited on any surface within the scope of the invention.

In FIG. 4b, the layer 410 is in the process of being oxidized. In one embodiment, the oxidation process includes a krypton/oxygen mixed plasma oxidation process. The mixed plasma process generates atomic oxygen or oxygen radicals in contrast to molecular oxygen or $O_2$ used in conventional thermal oxidation. The atomic oxygen is introduced to the layer from all exposed directions as indicated by arrows 440, creating an oxide portion 450. The atomic oxygen continues to react with the layer and creates an oxidation interface 422. As the reaction progresses, atomic oxygen diffuses through the oxide portion 450 and reacts at the oxidation interface 422 until the layer is completely converted to an oxide of the deposited material layer. FIG. 4c shows the resulting oxide layer 450 which spans a physical thickness 452 from the outer surface 430 to the interface 420.

In one embodiment, the processing variables for the mixed plasma oxidation include a low ion bombardment energy of less than 7 eV, a high plasma density above $10^{12}/cm^3$ and a low electron temperature below 1.3 eV. In one embodiment, the substrate temperature is approximately 400° C. In one embodiment, a mixed gas of 3% oxygen with the balance being krypton at a pressure of 1 Torr is used. In one embodiment, a microwave power density of 5 W/cm$^2$ is used. In one embodiment, the oxidation process provides a growth rate of 1.5 nm/min.

The low temperature mixed plasma oxidation process described above allows the deposited layer to be oxidized at a low temperature, which inhibits the formation of unwanted byproducts such as silicides and oxides. The mixed plasma process in one embodiment is performed at approximately 400° C. in contrast to prior thermal oxidation processes that are performed at approximately 1000° C. The mixed plasma oxidation process has also been shown to provide improved thickness variation on silicon (111) surfaces in addition to (100) surfaces. Although the low temperature mixed plasma process above describes the formation of alternate material oxides, one skilled in the art will recognize that the process can also be used to form $SiO_2$ oxide structures.

Metals chosen from group IVB of the periodic table form oxides that are thermodynamically stable such that the gate oxides formed will have minimal reactions with a silicon substrate or other structures during any later high temperature processing stages. Zirconium is one example of a metal selected from group IVB that forms a thermodynamically stable gate oxide. In particular, zirconium forms an oxide comprised of $ZrO_2$. Zirconium oxide $ZrO_2$ exhibits a dielectric constant of approximately 25, which allows for a thinner EOT than conventional $SiO_2$. In addition to the stable thermodynamic properties inherent in the oxides chosen, the novel process used to form the oxide layer is performed at lower temperatures than the prior art, which further inhibits reactions with the silicon substrate or other structures.

A transistor made using the novel gate oxide process described above will possess several novel features. By creating an oxide material with a higher dielectric constant (k) and controlling surface roughness during formation, a gate oxide can be formed with an EOT thinner than 2 nm. A thicker gate oxide that is more uniform, and easier to process can also be formed with the alternate material oxide of the present invention, the alternate material gate oxide possessing an EOT equivalent to the current limits of $SiO_2$ gate oxides. The smooth surface of the body region is preserved during processing, and a resulting transistor will have a smooth interface between the body region and the gate oxide with a surface roughness on the order of 0.6 nm.

Figure 5:
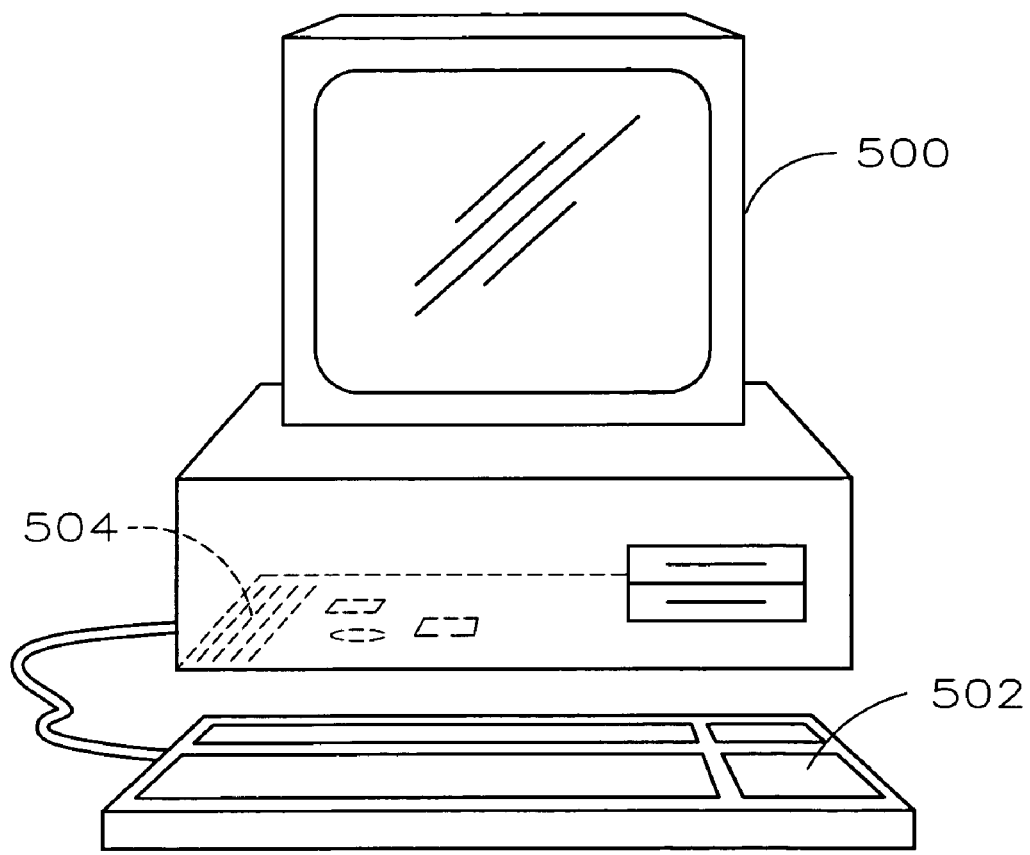
FIG. 5 shows a perspective view of a personal computer.
Figure 6:
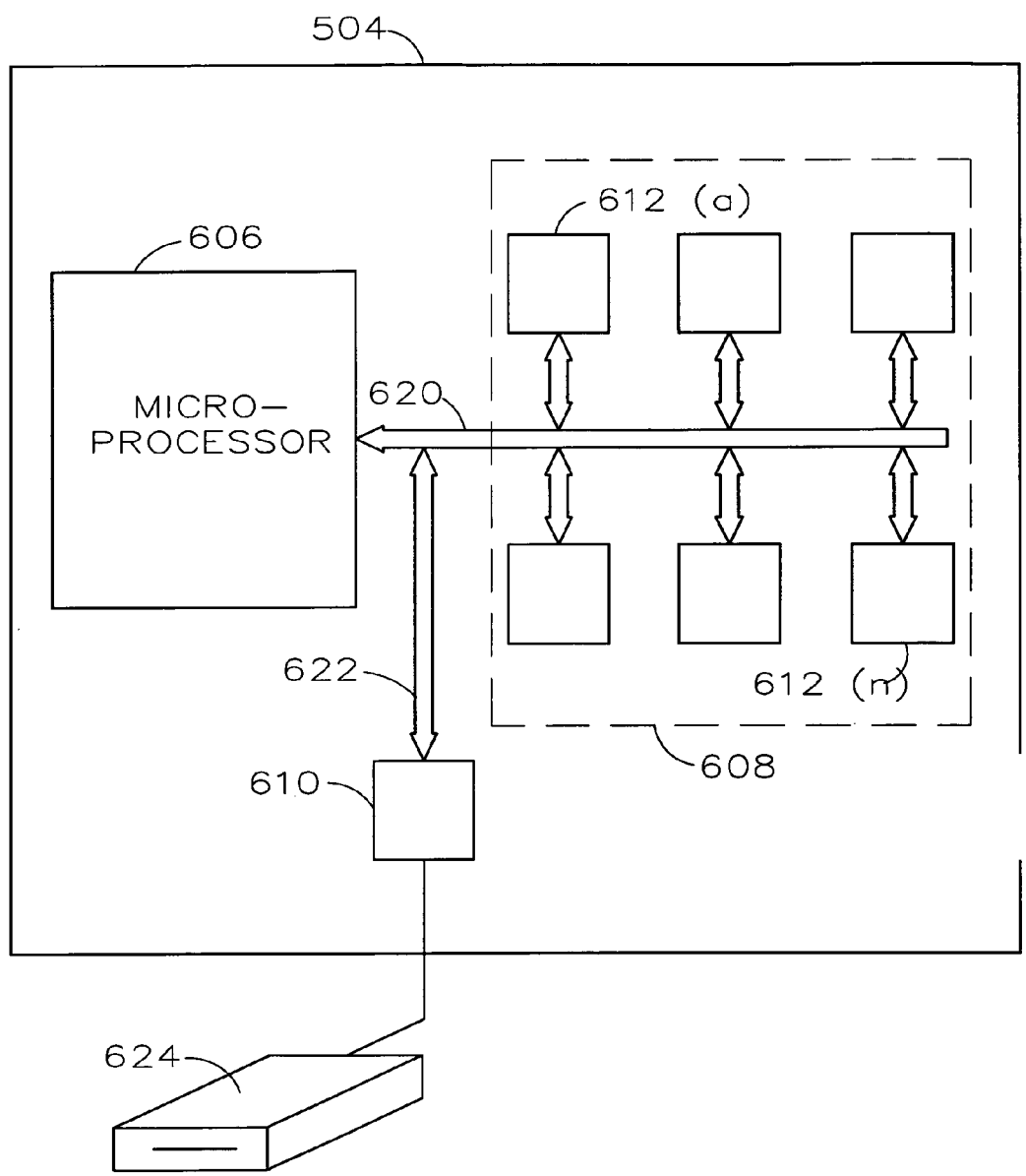
FIG. 6 shows a schematic view of a central processing unit.
Figure 7:
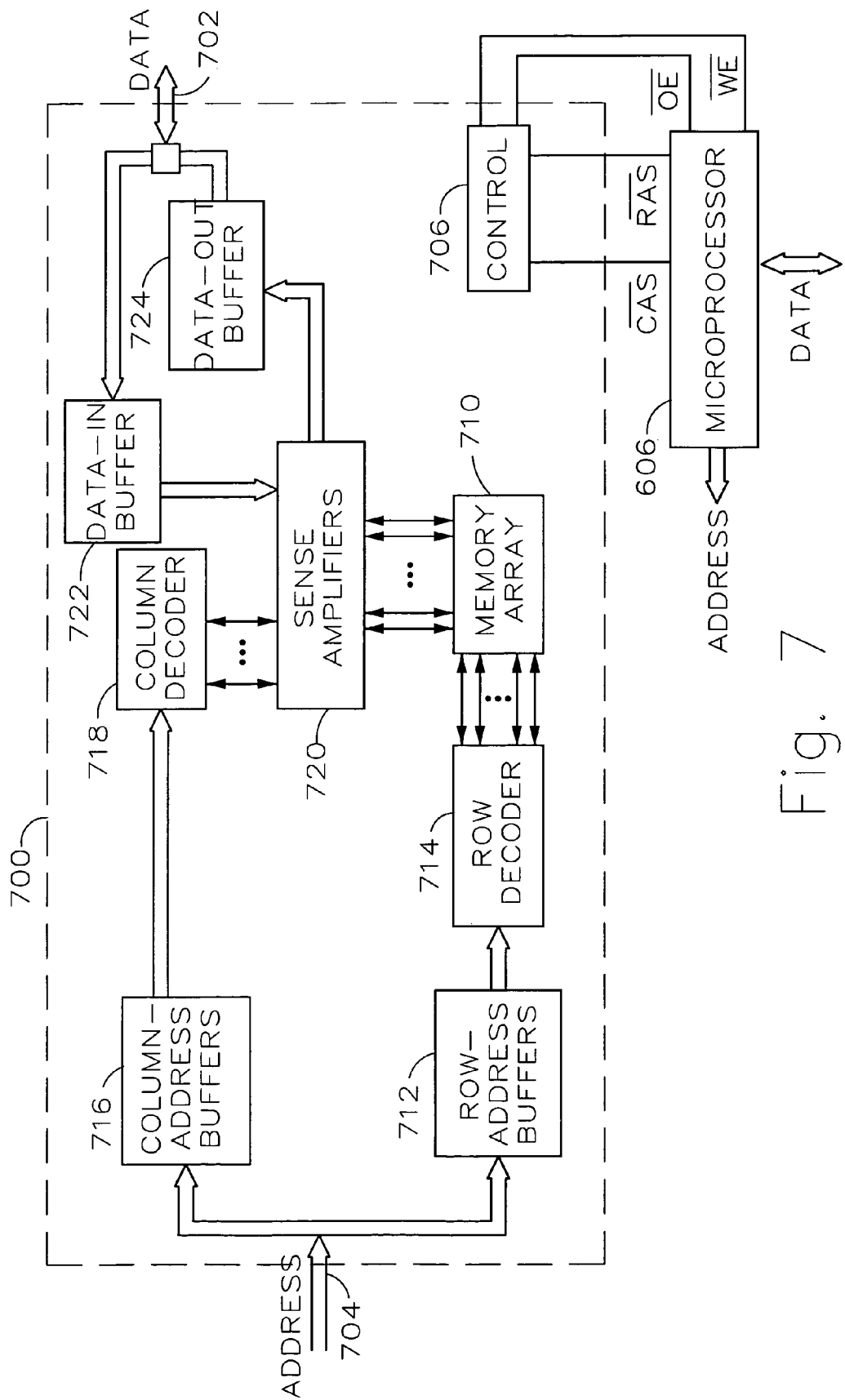
FIG. 7 shows a schematic view of a DRAM memory device.

Transistors created by the methods described above may be implemented into memory devices and information handling devices as shown in FIGS. 5-7 and described below. While specific types of memory devices and computing devices are shown below, it will be recognized by one skilled in the art that several types of memory devices and information handling devices could utilize the invention.

A personal computer, as shown in FIGS. 5 and 6, include a monitor 500, keyboard input 502 and a central processing unit 504. The processor unit typically includes microprocessor 606, memory bus circuit 608 having a plurality of memory slots 612(a-n), and other peripheral circuitry 610. Peripheral circuitry 610 permits various peripheral devices 624 to interface processor-memory bus 620 over input/output (I/O) bus 622. The personal computer shown in FIGS. 5 and 6 also includes at least one transistor having a gate oxide according to the teachings of the present invention.

Microprocessor 606 produces control and address signals to control the exchange of data between memory bus circuit 608 and microprocessor 606 and between memory bus circuit 608 and peripheral circuitry 610. This exchange of data is accomplished over high speed memory bus 620 and over high speed I/O bus 622.

Coupled to memory bus 620 are a plurality of memory slots 612(a-n) which receive memory devices well known to those skilled in the art. For example, single in-line memory modules (SIMMs) and dual in-line memory modules (DIMMs) may be used in the implementation of the present invention.

These memory devices can be produced in a variety of designs which provide different methods of reading from and writing to the dynamic memory cells of memory slots 612.

One such method is the page mode operation. Page mode operations in a DRAM are defined by the method of accessing a row of a memory cell arrays and randomly accessing different columns of the array. Data stored at the row and column intersection can be read and output while that column is accessed. Page mode DRAMs require access steps which limit the communication speed of memory circuit 608. A typical communication speed for a DRAM device using page mode is approximately 33 MHZ.

An alternate type of device is the extended data output (EDO) memory which allows data stored at a memory array address to be available as output after the addressed column has been closed. This memory can increase some communication speeds by allowing shorter access signals without reducing the time in which memory output data is available on memory bus 620. Other alternative types of devices include SDRAM, DDR SDRAM, SLDRAM and Direct RDRAM as well as others such as SRAM or Flash memories.

FIG. 7 is a block diagram of an illustrative DRAM device 700 compatible with memory slots 612(a-n). The description of DRAM 700 has been simplified for purposes of illustrating a DRAM memory device and is not intended to be a complete description of all the features of a DRAM. Those skilled in the art will recognize that a wide variety of memory devices may be used in the implementation of the present invention. The example of a DRAM memory device shown in FIG. 7 includes at least one transistor having a gate oxide according to the teachings of the present invention.

Control, address and data information provided over memory bus 620 is further represented by individual inputs to DRAM 700, as shown in FIG. 7. These individual representations are illustrated by data lines 702, address lines 704 and various discrete lines directed to control logic 706.

As is well known in the art, DRAM 700 includes memory array 710 which in turn comprises rows and columns of addressable memory cells. Each memory cell in a row is coupled to a common wordline. Additionally, each memory cell in a column is coupled to a common bitline. Each cell in memory array 710 includes a storage capacitor and an access transistor as is conventional in the art.

DRAM 700 interfaces with, for example, microprocessor 606 through address lines 704 and data lines 702. Alternatively, DRAM 700 may interface with a DRAM controller, a micro-controller, a chip set or other electronic system. Microprocessor 606 also provides a number of control signals to DRAM 700, including but not limited to, row and column address strobe signals RAS and CAS, write enable signal WE, an output enable signal OE and other conventional control signals.

Row address buffer 712 and row decoder 714 receive and decode row addresses from row address signals provided on address lines 704 by microprocessor 606. Each unique row address corresponds to a row of cells in memory array 710. Row decoder 714 includes a wordline driver, an address decoder tree, and circuitry which translates a given row address received from row address buffers 712 and selectively activates the appropriate wordline of memory array 710 via the wordline drivers.

Column address buffer 716 and column decoder 718 receive and decode column address signals provided on address lines 704. Column decoder 718 also determines when a column is defective and the address of a replacement column. Column decoder 718 is coupled to sense amplifiers 720. Sense amplifiers 720 are coupled to complementary pairs of bitlines of memory array 710.

Sense amplifiers 720 are coupled to data-in buffer 722 and data-out buffer 724. Data-in buffers 722 and data-out buffers 724 are coupled to data lines 702. During a write operation, data lines 702 provide data to data-in buffer 722. Sense amplifier 720 receives data from data-in buffer 722 and stores the data in memory array 710 as a charge on a capacitor of a cell at an address specified on address lines 704.

During a read operation, DRAM 700 transfers data to microprocessor 606 from memory array 710. Complementary bitlines for the accessed cell are equilibrated during a precharge operation to a reference voltage provided by an equilibration circuit and a reference voltage supply. The charge stored in the accessed cell is then shared with the associated bitlines. A sense amplifier of sense amplifiers 720 detects and amplifies a difference in voltage between the complementary bitlines. The sense amplifier passes the amplified voltage to data-out buffer 724.

Control logic 706 is used to control the many available functions of DRAM 700. In addition, various control circuits and signals not detailed herein initiate and synchronize DRAM 700 operation as known to those skilled in the art. As stated above, the description of DRAM 700 has been simplified for purposes of illustrating the present invention and is not intended to be a complete description of all the features of a DRAM. Those skilled in the art will recognize that a wide variety of memory devices, including but not limited to, SDRAMs, SLDRAMs, RDRAMs and other DRAMs and SRAMs, VRAMs and EEPROMs, may be used in the implementation of the present invention. The DRAM implementation described herein is illustrative only and not intended to be exclusive or limiting.

CONCLUSION

Thus has been shown a gate oxide and method of fabricating a gate oxide that produce a more reliable and thinner equivalent oxide thickness. Gate oxides formed from elements in group IVB of the periodic table are thermodynamically stable such that the gate oxides formed will have minimal reactions with a silicon substrate or other structures during any later high temperature processing stages. Zirconium oxide in particular has been shown to provide excellent electrical and thermodynamic properties. In addition to the stable thermodynamic properties inherent in the gate oxide of the invention, the process shown is performed at lower temperatures than the prior art, which further inhibits reactions with the silicon substrate or other structures.

Transistors and higher level ICs or devices have been shown utilizing the novel gate oxide and process of formation. The higher dielectric constant (k) oxide materials shown in one embodiment are formed with an EOT thinner than 2 nm, e.g. thinner than possible with conventional $SiO_2$ gate oxides. A thicker gate oxide that is more uniform, and easier to process has also been shown with at EOT equivalent to the current limits of $SiO_2$ gate oxides. In one embodiment of the present invention, the novel gate oxide provides a conduction band offset in a range of approximately 5.16 eV to 7.8 eV.

A novel process of forming a gate oxide has been shown where the surface smoothness of the body region is preserved during processing, and the resulting transistor has a smooth interface between the body region and the gate oxide with a surface roughness on the order of 0.6 nm. This solves the prior art problem of poor electrical properties such as high leakage current, created by unacceptable surface roughness.

Although specific embodiments have been illustrated and described herein, it will be appreciated by those of ordinary skill in the art that any arrangement which is calculated to achieve the same purpose may be substituted for the specific embodiment shown. This application is intended to cover any adaptations or variations of the present invention. It is to be understood that the above description is intended to be illustrative, and not restrictive. Combinations of the above embodiments, and other embodiments will be apparent to those of skill in the art upon reviewing the above description. The scope of the invention includes any other applications in which the above structures and fabrication methods are used. The scope of the invention should be determined with reference to the appended claims, along with the full scope of equivalents to which such claims are entitled.

What is claimed is:

1. A method of forming a gate oxide on a transistor body region, comprising:
    evaporation depositing a substantially amorphous and 0.99999 pure single element metal layer directly contacting a single crystal semiconductor portion of the body region using electron beam evaporation at a temperature between 150 to 200° C., the metal being chosen from the group IVB elements of the periodic table; and
    oxidizing the metal layer to form a metal oxide layer directly contacting the body region, wherein the metal oxide layer is amorphous and has a smooth surface with a surface roughness variation of 0.6 nm.

2. The method of claim 1, wherein evaporation depositing the metal layer includes evaporation depositing a zirconium layer.

3. The method of claim 1, wherein oxidizing the metal layer includes oxidizing at a temperature of approximately 400° C.

4. The method of claim 1, wherein oxidizing the metal layer includes oxidizing with atomic oxygen.

5. The method of claim 1, wherein oxidizing the metal layer includes oxidizing using a krypton (Kr)/oxygen ($O_2$) mixed plasma process.

6. A method of forming a gate oxide on a transistor body region, comprising:
    evaporation depositing a substantially amorphous and 0.99999 pure single element metal layer directly contacting a single crystal semiconductor portion of the body region using electron beam evaporation at a temperature between 150 to 200° C., the metal being chosen from the group IVB elements of the periodic table; and
    oxidizing the metal layer using a krypton (Kr)/oxygen ($O_2$) mixed plasma process to form a metal oxide layer directly contacting the body region, wherein the metal oxide layer is amorphous and has a smooth surface with a surface roughness variation of 0.6 nm.

* * * * *